US007999354B2

(12) United States Patent
Takahashi et al.

(10) Patent No.: US 7,999,354 B2
(45) Date of Patent: Aug. 16, 2011

(54) RESIN COMPOSITION, FILLING MATERIAL, INSULATING LAYER AND SEMICONDUCTOR DEVICE

(75) Inventors: Toyosei Takahashi, Utsunomiya (JP); Rie Takayama, Utsunomiya (JP); Hirohisa Dejima, Utsunomiya (JP); Junya Kusunoki, Utsunomiya (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 67 days.

(21) Appl. No.: 12/664,003

(22) PCT Filed: Jun. 11, 2008

(86) PCT No.: PCT/JP2008/060713
§ 371 (c)(1),
(2), (4) Date: Dec. 10, 2009

(87) PCT Pub. No.: WO2008/153082
PCT Pub. Date: Dec. 18, 2008

(65) Prior Publication Data
US 2010/0181684 A1 Jul. 22, 2010

(30) Foreign Application Priority Data

Jun. 12, 2007 (JP) ................................ 2007-155707
Apr. 18, 2008 (JP) ................................ 2008-108509

(51) Int. Cl.
*H01L 29/40* (2006.01)
(52) U.S. Cl. ........ 257/621; 257/698; 257/774; 257/781; 257/E23.011
(58) Field of Classification Search .................. 257/621, 257/698, 774, 781, E23.011
See application file for complete search history.

(56) References Cited

U.S. PATENT DOCUMENTS
6,856,023 B2 * 2/2005 Muta et al. .................... 257/774
(Continued)

FOREIGN PATENT DOCUMENTS
JP 2000-31397 1/2000
(Continued)

OTHER PUBLICATIONS
International Search Report for International Application No. PCT/JP2008/060713 mailed Jul. 22, 2008.

*Primary Examiner* — Tu-Tu V Ho
(74) *Attorney, Agent, or Firm* — Smith, Gambrell & Russell, LLP

(57) ABSTRACT

A resin composition of the present invention is used for forming a filling material which fills at least a through-hole of a semiconductor substrate, the through-hole extending through the semiconductor substrate in a thickness direction thereof and having a conductive portion therein. The resin composition is composed of: a resin having a radical-polymerizable double bond, a thermosetting resin and a resin which differs from the resin having the radical-polymerizable double bond and has an alkali-soluble group and a double bond; or a cyclic olefin resin. A filling material of the present invention is formed of a cured product of the above resin composition. An insulating layer of the present invention is formed of a cured product of the above resin composition. The insulating layer includes: a layer-shaped insulating portion provided on a surface opposite to a functional surface of the semiconductor substrate; and a filling portion integrally formed with the insulating portion and filling the through-hole. A semiconductor device of the present invention includes the above insulating layer.

17 Claims, 3 Drawing Sheets

U.S. PATENT DOCUMENTS

| | | |
|---|---|---|
| 2003/0151144 A1 | 8/2003 | Muta et al. |
| 2005/0067713 A1 | 3/2005 | Muta et al. |
| 2006/0071347 A1 | 4/2006 | Dotta |

FOREIGN PATENT DOCUMENTS

| | | |
|---|---|---|
| JP | 2001-209183 | 8/2001 |
| JP | 2001-352172 | 12/2001 |
| JP | 2003-289073 | 10/2003 |
| JP | 2004-123806 | 4/2004 |
| JP | 2005-216970 | 8/2005 |
| JP | 2006-16610 | 1/2006 |
| JP | 2006-108328 | 4/2006 |
| JP | 2006-343384 | 12/2006 |

* cited by examiner

RESIN COMPOSITION, FILLING MATERIAL, INSULATING LAYER AND SEMICONDUCTOR DEVICE

TECHNICAL FIELD

The present invention relates to a resin composition, a filling material, an insulating layer and a semiconductor device.

BACKGROUND ART

In order to miniaturize electronic components such as digital cameras and cellular phones and the like, semiconductor packages also need to be miniaturized.

In conventional semiconductor packages, bonding wires for connecting terminals of a semiconductor element and wirings of a semiconductor element mounting substrate together and a space in which the bonding wires can be placed are required. Therefore, the space has to be provided between the semiconductor element and the substrate in the semiconductor package. This interferes with the miniaturization of the semiconductor package.

Examples of a method of miniaturizing the semiconductor package include a method in which a functional surface of the semiconductor substrate included in the semiconductor element is electrically connected to a circuit wiring provided on a surface opposite to the functional surface together via penetrating electrodes formed so as to extend through the semiconductor substrate (see Patent Document 1).

In the method disclosed in Patent Document 1, through-holes are formed through a semiconductor substrate, a build-up layer for producing, for example, a laminated substrate is laminated on the semiconductor substrate so that the through-holes are filled with a constituent material of the build-up layer, and then a new hole is formed through the build-up layer within each through-hole. Thereafter, a conductive layer is formed on an inner surface defining the new hole to provide a conductive material (conductive portion). In this way, the penetrating electrodes are formed.

However, in the case where this method in which the through-holes are filled with the constituent material of build-up layer is used, there is a case that warpage of the semiconductor element increases.

Patent Document 1: Japanese Patent Application Laid-Open No. 2005-216970

DISCLOSURE OF THE INVENTION

It is an object of the present invention to provide a resin composition which can fill a through-hole formed through a semiconductor substrate reliably and sufficiently, while suppressing occurrence of warpage and the like of the semiconductor substrate. Further, it is another object of the present invention to provide a filling material and an insulating layer each formed of such a resin composition, as well as a semiconductor device including these filling material and insulating layer and having a small size and excellent properties.

In order to achieve the object, the present invention includes the following features (1) to (17):

(1) A resin composition used for forming a filling material which fills at least a through-hole of a semiconductor substrate, the through-hole extending through the semiconductor substrate in a thickness direction thereof and having a conductive portion therein, wherein the resin composition is composed of: a resin having a radical-polymerizable double bond, a thermosetting resin and a resin which differs from the resin having the radical-polymerizable double bond and has an alkali-soluble group and a double bond; or a cyclic olefin resin.

(2) The resin composition according to the above feature (1), wherein the semiconductor substrate has a functional surface and a surface opposite to the functional surface, and wherein the resin composition is used for forming an insulating layer which fills the through-hole and covers the opposite surface of the semiconductor substrate.

(3) The resin composition according to the above feature (1), wherein the semiconductor substrate has a functional surface and a surface opposite to the functional surface, and wherein the resin composition is used for forming an insulating layer which fills the through-hole and covers the opposite surface of the semiconductor substrate, wherein the resin composition has such a property that an opening can be formed through the insulating layer using a photolithography method.

(4) A filling material used for filling at least a through-hole of a semiconductor substrate, the through-hole extending through the semiconductor substrate in a thickness direction thereof and having a conductive portion therein, the filling material formed of a cured product of the resin composition according to the above feature (1).

(5) An insulating layer to be provided on a semiconductor substrate having at least a through-hole extending through the semiconductor substrate in a thickness direction thereof and having a conductive portion therein, a functional surface and a surface opposite to the functional surface, the insulating layer comprising:

a layer-shaped insulating portion provided on the opposite surface of the semiconductor substrate; and a filling portion integrally formed with the insulating portion and filling the through-hole, wherein the insulating layer is formed of a cured product of the resin composition according to the above feature (1).

(6) A semiconductor device comprising the filing material according to the above feature (4).

(7) A semiconductor device comprising the insulating layer according to the above feature (5).

(8) A semiconductor device comprising:

a semiconductor substrate having at least a through-hole extending through the semiconductor substrate in a thickness direction thereof, an inner surface defining the through-hole and one surface on which the through-hole is opened;

an insulating layer including a first resin layer formed so as to cover the inner surface defining the through-hole and the one surface of the semiconductor substrate, and a second resin layer applied to the first resin layer; and a conductive portion provided in the through-hole so as to pass through the first resin layer and the second resin layer, wherein an elastic modulus of the first resin layer is lower than that of the second resin layer.

(9) The semiconductor device according to the above feature (8), wherein the elastic modulus of the first resin layer is 2,500 MPa or lower.

(10) The semiconductor device according to the above feature (8), wherein the first resin layer is formed of a cured product of a first resin composition, and wherein the first resin composition is composed of: a resin having a radical-polymerizable double bond, a thermosetting resin and a resin which differs from the resin having the radical-polymerizable double bond and has an alkali-soluble group and a double bond; or a cyclic olefin resin.

(11) The semiconductor device according to the above feature (10), wherein the cyclic olefin resin comprises a norbornene resin having an epoxy group.

(12) The semiconductor device according to the above feature (8), wherein the first resin layer can be patterned by irradiation of light.

(13) The semiconductor device according to the above feature (8), wherein the elastic modulus of the second resin layer is 3,500 MPa or higher.

(14) The semiconductor device according to the above feature (8), wherein a coefficient of thermal expansion of the second resin layer at a glass transition temperature or lower temperature is 50 ppm or lower.

(15) The semiconductor device according to the above feature (8), further comprising a wiring pattern formed on a surface of the second resin layer opposite to the first resin layer and electrically connected to the conductive portion.

(16) The semiconductor device according to the above feature (15), wherein the insulating layer further includes a third resin layer formed so as to cover the conductive portion and at least a part of the wiring pattern and formed of a third resin composition, and wherein the third resin composition is composed of: a resin having a radical-polymerizable double bond, a thermosetting resin and a resin which differs from the resin having the radical-polymerizable double bond and has an alkali-soluble group and a double bond; or a cyclic olefin resin.

(17) The semiconductor device according to the above feature (8), further comprising a wiring pattern formed on a surface of the semiconductor substrate opposite to the insulating layer and electrically connected to the conductive portion.

BEST MODE FOR CARRYING OUT THE INVENTION

Hereinafter, a resin composition, a filling material, an insulating layer and a semiconductor device will be described.

The resin composition of the present invention is used for forming a filling material which fills at least a through-hole of a semiconductor substrate, the through-hole extending through the semiconductor substrate in a thickness direction thereof and having a conductive portion therein. The resin composition is composed of: a resin having a radical-polymerizable double bond, a thermosetting resin and a resin which differs from the resin having the radical-polymerizable double bond and has an alkali-soluble group and a double bond; a cyclic olefin resin; or a mixture thereof.

The filling material of the present invention is used for filling at least the through-hole and formed of a cured product of the above resin composition.

The insulating layer of the present invention is formed of a cured product of the above resin composition. The insulating layer comprises: a layer-shaped insulating portion provided on a surface opposite to a functional surface of the semiconductor substrate; and a filling portion integrally formed with the insulating portion which fills the through-hole.

The semiconductor device of the present invention comprises the above insulating layer.

Further, the semiconductor device of the present invention comprises: a semiconductor substrate having at least a through-hole extending through the semiconductor substrate in a thickness direction thereof, an inner surface defining the through-hole and one surface on which the through-hole is opened; an insulating layer including a first resin layer formed so as to cover the inner surface defining the through-hole and the one surface of the semiconductor substrate, and a second resin layer applied to the first resin layer; and a conductive portion provided in the through-hole so as to pass through the first resin layer and the second resin layer. In the semiconductor device, an elastic modulus of the first resin layer is lower than that of the second resin layer.

First, the resin composition and the filling material will be described.

Figure 1:
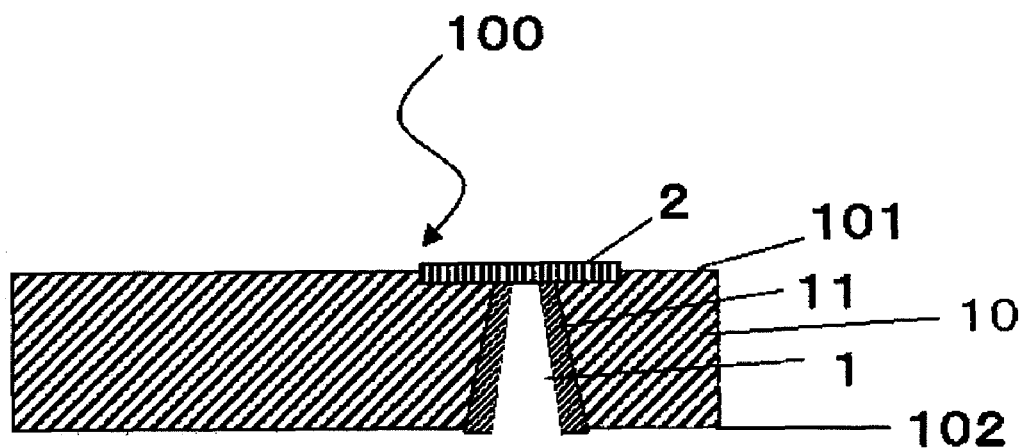
FIG. 1 is a vertical section view showing one example of a semiconductor element having a semiconductor substrate through which a through-hole is formed.

For example, as shown in FIG. 1, the resin composition is used for filling at least a through-hole 1 formed through a semiconductor substrate 10 of a semiconductor element 100. A terminal portion 2 of a functional surface 101 of the semiconductor substrate 10 and a surface 102 opposite to the functional surface 101 can be electrically connected together through a conductive material (conductive portion) 11 provided in the through-hole 1. This makes it possible to miniaturize a semiconductor device (semiconductor package) 500 comprising the semiconductor element 100.

As described above, the resin composition of the present invention is composed of: (A) a resin having a radical-polymerizable double bond, a thermosetting resin and a resin which differs from the resin having a radical-polymerizable double bond and has an alkali-soluble group and a double bond (that is, a constitution A); (B) a cyclic olefin resin (that is, a constitution B); or a mixture thereof.

Hereinafter, each of the resin composition having the constitution A and the resin composition having the constitution B will be described.

I: Resin Composition Having Constitution A

This resin composition contains the resin having the radical-polymerizable double bond. Thus, the resin composition can be selectively cured by irradiation of light. Examples of the resin having the radical-polymerizable double bond include a photo-curable resin (which is mainly cured by irradiation of light).

Examples of the resin having the radical-polymerizable double bond include an unsaturated polyester, an acryl compound such as an acrylic monomer or oligomer having at least one acryloyl group or methacryloyl group in one molecule thereof, a vinyl compound such as styrene, and the like. These compounds may be used alone or in a mixture of two or more.

Among them, a UV curable resin containing an acryl compound as a main component thereof is preferably used. This is because the acryl compound shows a rapid rate of curing when being irradiated with light so that the resin can be patterned even when it is exposed to a relatively low exposure amount of the light.

Examples of the acryl compound include a monomer of an acrylic acid ester or a methacrylic acid ester and the like; and specifically, a bifunctional acrylate such as ethylene glycol diacrylate, ethylene glycol dimethacrylate, 1,6-hexanediol diacrylate, 1,6-hexanediol dimethacrylate, glycerin diacrylate, glycerin dimethacrylate, 1,10-decanediol diacrylate or 1,10-decanediol dimethacrylate; a polyfunctional acrylate such as trimethylolpropane triacrylate, trimethylolpropane trimethacrylate, pentaerythritol triacrylate, pentaerythritol trimethacrylate, dipentaerythritol hexaacrylate or dipentaerythritol hexamethacrylate; and the like.

Among them, the (meth)acrylic acid ester is preferably used, and an acrylic or methacrylic alkyl ester having 1 to 15 carbon atoms in ester portions thereof is more preferably used. This makes it possible to improve reactivity of the resin having the radical-polymerizable double bond, thereby increasing sensitivity of the resin composition.

Further, the resin having the radical-polymerizable double bond (photo-curable resin) is not particularly limited to a specific type, but is preferably a resin kept in a liquid state at room temperature. This makes it possible to improve a filling property of the resin composition in the through-hole 1 provided through the semiconductor substrate 10. Further, this also makes it possible to improve UV curing reactivity of the resin having the radical-polymerizable double bond, and to easily perform an operation of mixing it with other components (e.g., a thermosetting resin). Examples of the resin having the radical-polymerizable double bond kept in the liquid state at room temperature include a UV curable resin containing the above acryl compound as a main component thereof, and the like.

A weight-average molecular weight of the resin having the radical-polymerizable double bond is not particularly limited to a specific value, but is preferably 5,000 or lower, and more preferably in the range of 150 to 3,000. By setting the weight-average molecular weight of the resin to fall within the above range, it is possible for the resin composition to particularly exhibit an excellent filling property.

The weight-average molecular weight can be evaluated using, for example, a gel permeation chromatography (GPC), and can be calculated by a calibration curve plotted using styrene standards.

An amount of the resin having the radical-polymerizable double bond contained in the resin composition is not particularly limited to a specific value, but is in the range of 5 to 60 wt %, and more preferably in the range of 8 to 30 wt %, based on a total amount of the resin composition. Particularly, the amount of the resin having the radical-polymerizable double bond contained in the resin composition is preferably 9 wt % or more, and more preferably 13 wt % or more, based on a total amount of resin components (all components excluding an inorganic filler) contained in the resin composition.

If the amount of the resin having the radical-polymerizable double bond is more than the upper limit value of the above range, there is a case that heat resistance of a cured product of the resin composition is deteriorated. On the other hand, if the amount of the resin having the radical-polymerizable double bond is less than the lower limit value of the above range, there is a case that flexibility of a resin layer formed of the resin composition is deteriorated, and there is a fear that the resin layer cannot be sufficiently patterned by irradiation of light (e.g., UV light). For these reasons, by setting the amount of the resin having the radical-polymerizable double bond to fall within the above range, it is possible to provide a resin composition which does not lower the heat resistance of the cured product thereof and the flexibility of the resin layer formed of it, that is, a resin composition which can impart the heat resistance to the cured product and the flexibility to the resin layer in excellent balance. Especially, it is possible to provide a resin composition which can impart an excellent peelable property for a protective film or the like to a bonding film in which the resin layer formed of the resin composition is used.

The resin composition contains a thermosetting resin. This makes it possible to improve the heat resistance (specifically, reflow resistance at 240° C.) of the cured product of the resin composition.

Examples of the thermosetting resin include: phenol resin such as novolak type phenol resin (e.g., phenol novolak resin, cresol novolak resin, bisphenol A novolak resin) or resol phenol resin; epoxy resin such as bisphenol type epoxy resin (e.g., bisphenol A epoxy resin, bisphenol F epoxy resin), novolak type epoxy resin (e.g., novolak epoxy resin, cresol novolak epoxy resin), biphenyl type epoxy resin, stilbene type epoxy resin, triphenol methane type epoxy resin, alkyl-modified triphenol methane type epoxy resin, triazine ring containing epoxy resin, dicyclopentadiene-modified phenol type epoxy resin or silicone-modified epoxy resin; urea resin; triazine ring containing resin such as melamine resin; unsaturated polyester resin; bismaleimide resin; polyurethane resin; diallyl phthalate resin; silicone resin; benzooxazine ring containing resin; cyanate ester resin; and the like. These resins may be used alone or in a mixture of two or more. Among these resins, the epoxy resin is more preferably used. This makes it possible to further improve the heat resistance and adhesion property of the cured product of the resin composition.

As the thermosetting resin, an epoxy resin kept in a solid state at room temperature (e.g., bisphenol type epoxy resin) and an epoxy resin kept in a liquid state at room temperature which is a flexible epoxy resin (e.g., silicone-modified epoxy resin kept in a liquid form at room temperature) may also be used in combination. This makes it possible to provide a resin composition which can impart the flexibility to the resin layer formed of it, resolution to the resin layer in patterning carried out using a photolithography method and an adhesion property to the resin layer in excellent balance, while maintaining the heat resistance of the cured product thereof.

An amount of the thermosetting resin contained in the resin composition is not particularly limited to a specific value, but is preferably in the range of 10 to 40 wt %, and more preferably in the range of 15 to 35 wt %, based on the total amount of the resin composition. If the amount of the thermosetting resin is less than the lower limit value of the above range, there is a case that the effect of improving the heat resistance of the cured product of the resin composition is lowered. On the other hand, if the amount of the thermosetting resin exceeds the upper limit value of the above range, there is a case that the effect of improving toughness of the cured product of the resin composition is lowered. For these reason, by setting the amount of the thermosetting resin to fall within the above range, it is possible to provide a resin composition which can impart the heat resistance and toughness to the cured product in excellent balance.

In the case where the liquid thermosetting resin is used in combination with the resin having the radical-polymerizable resin kept in the liquid state, a total amount thereof is preferably 60 wt % or less, and more preferably 50 wt % or less, based on the total amount of the resin composition. Particularly, the total amount of the thermosetting resin and the resin having the radical-polymerizable resin is preferably 13 wt % or more, more preferably 14 wt % or more, and even more preferably 18 wt % or more, based on the total amount of the resin components (all components excluding the inorganic filler). In contrast, by setting the total amount of the thermosetting resin and the resin having the radical-polymerizable double bond to fall within the above range, it is possible to particularly improve the filling property of the resin composition in the through-hole 1 provided through the semiconductor substrate 10. Further, it is also possible for the resin layer (bonding layer) formed of the resin composition to have the adhesion property and resolution in patterning carried out using the photolithography method in excellent balance, and to have excellent flexibility. In addition, it is also possible for the cured product of the resin composition to have excellent heat resistance.

The resin composition contains "the resin having the alkali-soluble group and the double bond" which differs from the resin having the radical-polymerizable double bond. This makes it possible for a resin layer formed of the resin composition to be developed by an alkaline developer, thereby patterning the resin layer by irradiation of light. As used herein, the phrase "differs from the resin having the radical-polymerizable double bond" means that chemical structures of the resins differ from each other. Examples of the resin having the alkali-soluble group and the double bond include a resin curable by both light and heat.

Examples of the alkali-soluble group include a hydroxyl group, a carboxyl group and the like. Further, the alkali-soluble group also can contribute to a thermosetting reaction. Examples of such a resin include: a thermosetting resin having a photo-reactive group such as an acryloyl group, a methacryloyl group or a vinyl group; a photo-curable resin having a thermal reactive group such as a phenolic hydroxyl group, an alcoholic hydroxyl group, a carboxyl group or an acid anhydride group; and the like. In this regard, it is to be noted that the photo-curable resin may further have a thermal reactive group such as an epoxy group, an amino group or a cyanate group. Specifically, examples of the resin include (meth)acryl-modified phenol resin, a (meth)acryloyl group-containing acrylic acid polymer and the like. Among them, the (meth)acryl-modified phenol resin is preferably used. In the case where the alkali-soluble group of the resin having the alkali-soluble group includes a double bond moiety in a chemical structure thereof, when unreacted resin (resin composition) is removed in a developing process, it is possible to use an alkaline aqueous solution with a low impact on the environment as compared with a conventionally used organic solvent as a developing solution. Further, in this case, the double bond moiety contributes to the curing reaction of the resin composition. This makes it possible to improve the heat resistance of the cured product of the resin composition.

In this regard, it is to be noted that as the above resin curable by both light and heat, those described as the thermosetting resin and the photo-curable resin can be used. Further, the resin having the alkali-soluble group and the double bond can be obtained by introducing the thermal reactive group into the photo-curable resin or introducing the photo-reactive group into the thermosetting resin.

Here, in the case where the thermosetting resin having the photo-reactive group is used, a ratio of modification (substitution) of the photo-reactive group is not particularly limited to a specific value, but is preferably in the range of 20 to 80%, and more preferably in the range of 30 to 70%, based on a total reactive group of the resin having the alkali-soluble group and the double bond. By setting the ratio of modification of the photo-reactive group to fall within the above range, it is possible to provide a resin composition having particularly excellent resolution.

On the other hand, in the case where the photo-curable resin having the thermal reactive group is used, a ratio of modification (substitution) of the thermal reactive group is not particularly limited to a specific value, but is preferably in the range of 20 to 80%, and more preferably in the range of 30 to 70%, based on the total reactive group of the resin having the alkali-soluble group and the double bond. By setting the ratio of modification of the thermal reactive group to fall within the above range, it is possible to provide a resin composition having particularly excellent resolution.

A weight-average molecular weight of the resin having the alkali-soluble group and the double bond is not particularly limited to a specific value, but is preferably 300,000 or lower, and more preferably in the range of 5,000 to 150,000. By setting the weight-average molecular weight of the resin to fall within the above range, it is possible to obtain a resin composition having a particularly excellent filling property.

Here, the weight-average molecular weight can be evaluated using, for example, a gel permeation chromatography (GPC), and can be calculated by a calibration curve plotted using styrene standards.

Further, an amount of the resin having the alkali-soluble group and the double bond contained in the resin composition is not particularly limited to a specific value, but is preferably in the range of 15 to 50 wt %, and more preferably in the range of 20 to 40 wt %, based on the total amount of the resin composition. Particularly, it may be preferably in the range of 10 to 80 wt %, and more preferably in the range of 15 to 70 wt %, based on the total amount of the resin components (all components excluding the inorganic filler) contained in the resin composition. If the amount of the resin having the alkali-soluble group and the double bond is less than the lower limit of the above range, there is a case that the effect of improving compatibility between the photo-curable resin and the thermosetting resin is lowered. On the other hand, if it exceeds the upper limit of the above range, there is a case that developability of the resin layer formed of the resin composition and the resolution of the resin layer in patterning carried out using the photolithography method is lowered. In contrast, by setting the amounts of the resin having the alkali-soluble group and the double bond or the liquid components contained in the resin composition to fall within the above range, it becomes possible for the resin layer formed of the resin composition to be thermally pressed after being patterned by the photolithography method.

Further, it is preferred that the resin composition may additionally contain a photoinitiator. This makes it possible for the resin composition to be efficiently patterned by photopolymerization.

Examples of the photoinitiator include benzophenon, acetophenone, benzoin, benzoin isobutyl ether, methyl benzoin benzoic acid, benzoin benzoic acid, benzoin methyl ether, benzyl phenyl sulfide, benzil, dibenzil, biacetyl and the like.

An amount of the photoinitiator contained in the resin composition is not particularly limited to a specific value, but is preferably in the range of 0.5 to 5 wt %, and more preferably in the range of 0.8 to 2.5 wt %, based on the total amount of the resin composition. If the amount of the photoinitiator is less than the lower limit of the above range, there is a case that the effect of initiating photo-polymerization is lowered. On the other hand, if it exceeds the upper limit of the above range, there is a case that reactivity of the resin composition is excessively increased, thereby lowering stability of the resin composition before use or the resolution of the resin layer formed of the resin composition after being patterned. For these reasons, by setting the amount of the photoinitiator to fall within the above range, it is possible to provide a resin composition having the above properties in excellent balance.

In addition, in the case where properties such as heat resistance, dimensional stability or moisture resistance are especially required for the resin composition, it is preferred that the resin composition additionally contains an inorganic filler. Further, in the case where the resin composition contains the inorganic filler, it is possible to improve the peel property for a protective film of the bonding film in which the resin layer formed of the resin composition is used.

Examples of such an inorganic filler include: silicates such as talc, baked clay, un-baked clay, mica and glass; oxides such as titanium oxide, alumina, fused silica (e.g., fused spherical silica or flake-type fused silica) and silica powder (e.g., crystalline silica); carbonates such as calcium carbonate, magnesium carbonate and hydrotalcite; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; nitrides such as aluminum nitride, boron nitride and silicon nitride; and the like. These inorganic fillers may be used alone or in a mixture of two or more. Among them, the fused silica or the silica powder such as the crystalline silica is preferably used, and the spherical fused silica is more preferably used.

In the case where the resin composition contains the inorganic filler, it is possible to improve the heat resistance, moisture resistance and strength thereof after being cured. Further, it is also possible to improve the peelable property for a protective film of the bonding film in which the resin layer formed of the resin composition is used. In this regard, it is to be noted that a shape of the inorganic filler is not particularly limited to a specific type, but is preferably a spherical form. This makes it possible to provide a resin composition which is suitable for forming a bonding layer for a bonding film having no anisotropic property.

Further, an average particle size of particles of the inorganic filler is not particularly limited to a specific value, but is preferably in the range of 0.05 to 30 μm, and more preferably in the range of 0.1 to 10 μm. If the average particle size is smaller than the lower limit of the above range, there is a case that the particles of the inorganic filler tend to be aggregated, thereby lowering the strength of the resin layer formed of the resin composition. On the other hand, if it exceeds the upper limit of the above range, there is a case that the resolution of the resin layer formed of the resin composition is lowered in patterning carried out using exposure and photolithography methods.

Further, an amount of the inorganic filler contained in the resin composition is not particularly limited to a specific value, but is preferably in the range of 5 to 60 wt %, and more preferably in the range of 10 to 50 wt %, based on the total amount of the resin composition. If the amount of the inorganic filer is less than the lower limit value of the above range, there is a case that the effect of improving the heat resistance, dimensional stability and moisture absorbing property of the cured product of the resin composition is lowered. On the other hand, if it exceeds the upper limit of the above range, the resolution of the resin layer formed of the resin composition is lowered in patterning carried out using the photolithography method.

Moreover, the resin composition may further contain a flexible epoxy resin.

In the case where the resin composition further contains a flexible epoxy resin, it is possible to improve flexibility of the resin layer formed of the resin composition and a cured product thereof, while maintaining the heat resistance of the cured product of the resin composition. In addition, it is also possible to further improve reliability of the resin composition as a semiconductor material.

Examples of the flexible epoxy resin include silicone-modified epoxy resin, polyethyleneglycol diglycidyl ether, polypropylenediglycidyl ether and the like.

An amount of the flexible epoxy resin contained in the resin composition is not particularly limited to a specific value, but is preferably in the range of 3 to 10 wt %, and more preferably in the range of 4 to 8 wt %, based on the total amount of the resin composition. If the amount of the flexible epoxy resin is less than the lower limit value of the above range, there is a case that the effect of improving the reliability of the resin composition as the semiconductor material is lowered. On the other hand, if it exceeds the upper limit value of the above range, there are cases that the developability or resolution of the resin layer formed of the resin composition is lowered and that bleeding of the resin composition occurs.

The resin composition may contain additives such as a UV absorbing agent and a leveling agent within a range that does not impair the object of the present invention.

A film for through-hole filling material can be obtained by mixing such a resin composition with a suitable organic solvent (e.g., N-methyl-2-pyrrolidone, anisole, methyl ethyl ketone, toluene, ethyl acetate) to prepare a resin composition solution, applying the resin composition solution to, for example, a support film or the like, and then drying the same.

A lowest melt viscosity at a temperature range of room temperature to 180° C. of the above obtained film for through-hole filling material is not particularly limited to a specific value, but is preferably 50,000 Pa·s or lower, and more preferably 3,000 Pa·s or lower. By setting the lowest melting viscosity at a filling temperature to fall within the above range, it becomes possible for the film for through-hole filling material to particularly have an excellent filling property. Further, such a film for through-hole filling material can have excellent adhesion property and wettability with respect to an object to be bonded (adherent) in addition to suitable flowability.

The film for through-hole filling material can fill the through-hole 1 provided through the semiconductor element 100 (the semiconductor substrate 10) by laminating the film on the semiconductor element 100. Thereafter, by thermally curing the film for through-hole filling material, it is possible to obtain a through-hole filling material (a filling material of the present invention).

By using such a resin composition, an object to be bonded (an adherent) such as a semiconductor element and another object to be bonded (another adherent) such as a semiconductor part (e.g., a substrate) can be bonded together as follows. Specifically, the resin composition is applied to any one of the objects to be bonded, and then is irradiated with light through a mask, so that the resin having the radical-polymerizable double bond contained in the resin composition is cured to immobilize a cured portion of the resin composition. Subsequently, by treating the resin composition with a developer solution such as an alkaline solution, an unreacted resin having the alkali-soluble group and the double bond is dissolved by the alkaline solution to remove an uncured portion from the resin composition. As a result, a patterned bonding layer (a layer formed of the resin composition after being cured) is formed on the one object to be bonded (that is, the semiconductor element or the substrate). While using the light-cured bonding layer as a spacer, the other object to be bonded (e.g., a glass substrate for protecting the semiconductor element) is placed on the bonding layer, and then the bonding layer is post-cured using a thermal treatment. By doing so, the bonding layer is post-cured between the objects to be bonded (e.g., between the semiconductor element and the glass substrate) due to reaction of the thermosetting resin (e.g., the epoxy resin) contained in the resin composition so that the objects can be bonded together through the post-cured bonding layer. Namely, since the thermosetting resin contained in the resin composition does not substantially react even after the patterning step, it can flow out to surfaces of the bonding layer by subjecting the bonding layer to press or thermal press, to thereby make contact with the objects. Further, by pressing the bonding layer at a temperature higher than a glass transition temperature of the resin having the radical-polymerizable double bond (photo-curable resin) cured by the irradiation of light, the cured resin is softened so that it can contribute to an increase in bonding strength between the bonding layer and the objects. Furthermore, an unreacted thermosetting resin serves as a plasticizer for the already cured resin having the radical-polymerizable double bond (photo-curable resin), to thereby improve the bonding strength between the bonding layer and the objects. By setting a thickness of the bonding layer (film) to a suitable value, the bonding layer provided between the two objects can reliably serve as the spacer.

II: Resin Composition Having Constitution B

This resin composition contains the cyclic olefin resin. This makes it possible to improve heat resistance of a cured product of the resin composition in a process of the semiconductor device 500 or heat resistance reliability of the manufactured semiconductor device 500.

Another thermoplastic resin also may be used instead of or in combination with the cyclic olefin resin. Examples of such a thermoplastic resin include polyamide, polyacetal, polycarbonate, polybutylene terephthalate, polyethylene terephthalate, polyimide, polyamide imide, polyether sulfone, polyether ether ketone, polyphenylene sulfone, polymethyl pentene and the like.

As a polymerization method for producing the cyclic olefin resin to be used in the present invention, a known method such as a random polymerization method or a block polymerization method can be used. Specific examples of the cyclic olefin resin include a (co)polymer obtained by (co)polymerizing a norbornene type monomer, a copolymer obtained by copolymerizing a norbornene type monomer with another copolymerizable monomer such as α-olefin, copolymers obtained by hydrogenating to these copolymers, and the like. These cyclic olefin resins can be produced by known polymerization methods including an addition polymerization method and a ring-opening polymerization method. Among them, a (co)polymer obtained by addition (co)polymerizing the norbornene type monomer is preferably used, but is not particularly limited thereto in the present invention.

Examples of an addition polymer of the cyclic olefin resin include a polynorbornene addition polymer such as (1) an addition (co)polymer obtained by addition (co)polymerizing a norbornene type monomer, (2) an addition copolymer obtained by addition copolymerizing a norbornene type monomer with ethylenes or α-olefin, and (3) an addition copolymer obtained by addition copolymerizing a norbornene type monomer with a non-conjugated diene and, if needed, another monomer. These resins can be obtained using any known polymerization methods.

Examples of a ring-opened polymer of the cyclic olefin resin include a polynorbornene ring-opened polymer such as (4) a ring-opened (co)polymer obtained by ring-opening (co)polymerizing a norbornene type monomer and a (co)polymer obtained by, if needed, hydrogenating the above ring-opened (co)polymer, (5) a ring-opened copolymer obtained by copolymerizing a norbornene type monomer with ethylene or α-olefin and a copolymer obtained by, if needed, hydrogenating the above ring-opened copolymer, and (6) a ring-opened copolymer obtained by copolymerizing a norbornene type monomer with a non-conjugated diene or another monomer and a copolymer obtained by, if needed, hydrogenating the above ring-opened copolymer. These resins can be obtained using any known polymerization methods.

Among them, (1) the addition (co)polymer obtained by addition (co)polymerizing the norbornene type monomer is preferably used, but is not particularly limited thereto in the present invention.

Among these cyclic olefin resins, a cyclic olefin resin having a functional group is preferably used. This makes it possible to improve an adhesion property of the resin composition to various organic materials or inorganic materials constituting the semiconductor device 500.

Examples of such a functional group include an epoxy group, an ester group, a ketone group, an ether group and the like. Among them, the cyclic olefin resin having the epoxy group is more preferably used. This makes it possible to further improve the adhesion property of the resin composition to the various organic materials or inorganic materials constituting the semiconductor device 500, heat resistance of the semiconductor device 500 in process thereof or the heat resistance reliability of the manufactured semiconductor device 500.

Although the cyclic olefin resin having the epoxy group can be generally obtained by directly polymerizing a monomer containing the epoxy group in a molecule thereof, it also can be obtained by introducing the epoxy group into a side-chain of a polymer produced via a modification reaction. Such a modification reaction can be carried out using known methods such as a method of graft reacting an unsaturated monomer containing the epoxy group with the above polymer, a method of reacting a compound containing the epoxy group with a reactive functional group site of the above polymer, and a method of directly epoxidating the above polymer having a carbon-carbon double bond in a molecule thereof using an epoxidating agent such as peroxy acid or hydroperoxide.

The addition polymer of the cyclic olefin resin can be obtained via coordination polymerization reaction using a metal catalyst, or via radical polymerization reaction. In the coordination polymerization reaction, the addition polymer can be obtained by polymerizing a monomer in a solution in the presence of a transition metal catalyst (NICOLE R. GROVE et al., Journal of Polymer Science: part B, Polymer Physics, Vol. 37, 3003-3010 (1999)).

A nickel or platinum catalyst to be typically used as the metal catalyst in the coordination polymerization reaction is described in PCT WO 97/33,198 and PCT WO 00/20,472. Examples of the metal catalyst for the coordination polymerization reaction include known catalysts such as (toluene) bis(perfluorophenyl) nickel, (methylene) bis(perfluorophenyl) nickel, (benzene) bis(perfluorophenyl) nickel, bis(tetrahydro)bis(perfluorophenyl) nickel, bis(ethyl acetate) bis (perfluorophenyl) nickel, bis(dioxane) bis(perfluorophenyl) nickel, and the like.

The radical polymerization reaction is described in Encyclopedia of Polymer Science, John Wiley & Sons, 13,708 (1988).

In general, the radical polymerization reaction is carried out by reacting a monomer in a solution at a temperature of 50 to 150° C. in the presence of a radical initiator. Examples of the radical initiator include azobis(isobutyronitrile) (AIBN), benzoyl peroxide, lauryl peroxide, azobis(isocaptronitrile), azobis(isoleronitrile), t-butyl hydroperoxide, and the like.

The ring-opened (co)polymer of the cyclic olefin resin can be obtained by ring-opening (co)polymerizing at least one kind of the norbornene type monomer in the presence of a titanium or tungsten compound as a catalyst using known ring-opening (co)polymerization reaction. If needed, a carbon-carbon double bond of the ring-opened (co)polymer may be hydrogenated using a conventional hydrogenation method. In this case, it is possible to obtain a thermoplastic saturated norbornene resin.

A solvent suitable for the polymerization reaction includes a hydrocarbon solvent or an aromatic solvent. Examples of the hydrocarbon solvent include, but are not particularly limited to, pentane, hexane, heptane, cyclohexane and the like. Examples of the aromatic solvent include, but are not particularly limited to, benzene, toluene, xylene, mesitylene and the like. Diethyl ether, tetrahydrofuran, ethyl acetate, esters, lactones, ketones, amides also may be used as the solvent. These solvents suitable for the polymerization reaction may be used alone or in a mixture of two or more.

A molecular weight of the cyclic olefin resin to be used in the present invention can be controlled by adjusting a ratio of the initiator and the monomer or by adjusting a time in the polymerization reaction. In the case where the above coordination polymerization reaction is carried out, as disclosed in U.S. Pat. No. 6,136,499, the molecular weight can be controlled using a chain transfer catalyst. In the present invention, α-olefin such as ethylene, propylene, 1-hexene, 1-decene or 4-methyl-1-pentene is preferably used in order to control the molecular weight.

In the present invention, a weight-average molecular weight of the cyclic olefin resin is in the range of 10,000 to 500,000, preferably in the range of 30,000 to 100,000, and more preferably in the range of 50,000 to 80,000. The weight-average molecular weight can be measured using a gel permeation chromatography (GPC) based on standard polynorbornene (in accordance with ASTMDS3536-91).

As a cyclic olefin monomer to be used for producing the cyclic olefin resin having the epoxy group, it is preferable to use a norbornene type monomer represented by the following formula (1).

[Formula 1]

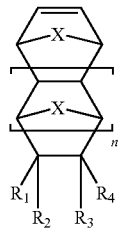

(1)

wherein "X" is any one of O, $CH_2$ and $(CH_2)_2$, and "n" is an integer of 0 to 5. Each of $R_1$ to $R_4$ is a hydrogen atom, an alkyl group, an alkenyl group, an alkynyl group, an allyl group, an aryl group, an aralkyl group, a functional group containing an ester group, a functional group containing a ketone group, a functional group containing an ether group or a functional group containing an epoxy group. In the norbornene type monomers to be used for producing the cyclic olefin resin having the epoxy group, $R_1$s to $R_4$s may be different from each other, but at least one of $R_1$s to $R_4$s in all the norbornene type monomers is the functional group containing the epoxy group.

Specific examples of the alkyl group include, but are not particularly limited to, a methyl group, an ethyl group, a propyl group, an isopropyl group, a butyl group, a pentyl group, a hexyl group, a heptyl group, an octyl group, a nonyl group, a decyl group, a dodecyl group, a cyclopentyl group, a cyclohexyl group, a cyclooctyl group and the like. Specific examples of the alkenyl group include, but are not particularly limited to, a vinyl group, an allyl group, a butynyl group, a cyclohexenyl group and the like. Specific examples of the alkynyl group include, but are not particularly limited to, an ethynyl group, a 1-propynyl group, a 2-propynyl group, a 1-butynyl group, a 2-butynyl group and the like. Specific examples of the aryl group include, but are not particularly limited to, a phenyl group, a naphthyl group, an anthracenyl group and the like. Specific examples of the aralkyl group include, but are not particularly limited to, a benzyl group, a phenethyl group and the like.

Examples of the cyclic olefin monomer to be used for producing the cyclic olefin resin include: the monomer having the alkyl group such as 5-methyl-2-norbornene, 5-ethyl-2-norbornene, 5-propyl-2-norbornene, 5-butyl-2-norbornene, 5-pentyl-2-norbornene, 5-hexyl-2-norbornene, 5-heptyl-2-norbornene, 5-octyl-2-norbornene, 5-nonyl-2-norbornene or 5-decyl-2-norbornene; the monomer having the alkenyl group such as 5-allyl-2-norbornene, 5-methylidene-2-norbornene, 5-ethylidene-2-norbornene, 5-isopropylidene-2-norbornene, 5-(2-propenyl)-2-norbornene, 5-(3-butenyl)-2-norbornene, 5-(1-methyl-2-propenyl)-2-norbornene, 5-(4-pentenyl)-2-norbornene, 5-(1-methyl-3-butenyl)-2-norbornene, 5-(5-hexenyl)-2-norbornene, 5-(1-methyl-4-pentenyl)-2-norbornene, 5-(2,3-dimethyl-3-butenyl)-2-norbornene, 5-(2-ethyl-3-butenyl)-2-norbornene, 5-(3,4-dimethyl-4-pentenyl)-2-norbornene, 5-(7-octenyl)-2-norbornene, 5-(2-methyl-6-heptenyl)-2-norbornene, 5-(1,2-dimethyl-5-hexenyl)-2-norbornene, 5-(5-ethyl-5-hexenyl)-2-norbornene or 5-(1,2,3-trimethyl-4-pentenyl)-2-norbornene; the monomer having the alkynyl group such as 5-ethynyl-2-norbornene; the monomer having a silyl group such as 1,1,3,3,5,5-hexamethyl-1,5-dimethyl bis((2-(5-norbornene-2-yl)ethyl) trisiloxane); the monomer having the aryl group such as 5-phenyl-2-norbornene, 5-naphthyl-2-norbornene or 5-pentafluorophenyl-2-norbornene; the monomer having the aralkyl group such as 5-benzyl-2-norbornene, 5-phenethyl-2-norbornene, 5-pentafluorophenyl methane-2-norbornene, 5-(2-pentafluorophenyl ethyl)-2-norbornene or 5-(3-pentafluorophenyl propyl)-2-norbornene; the monomer having an alkoxy silyl group such as dimethyl bis((5-norbornene-2-yl) methoxy))silane, 5-trimethoxysilyl-2-norbornene, 5-triethoxysilyl-2-norbornene, 5-(2-trimethoxysilyl ethyl)-2-norbornene, 5-(2-triethoxysilyl ethyl)-2-norbornene, 5-(3-trimethoxysilyl propyl)-2-norbornene, 5-(4-trimethoxysilyl butyl)-2-norbornene or 5-trimethyl silyl methyl ether-2-norbornene; a monomer having a hydroxyl, ether, carboxyl, ester, acryloyl or methacryloyl group such as 5-norbornene-2-methanol and alkyl ether thereof, acetic acid 5-norbornene-2-methyl ester, propionic acid 5-norbornene-2-methyl ester, butyric acid 5-norbornene-2-methyl ester, valeric acid 5-norbornene-2-methyl ester, caproic acid 5-norbornene-2-methyl ester, caprylic acid 5-norbornene-2-methyl ester, capric acid 5-narbornene-2-methyl ester, lauric acid 5-norbornene-2-methyl ester, stearic acid 5-norbornene-2-methyl ester, oleic acid 5-norbornene-2-methyl ester, linolenic acid 5-norbornene-2-methyl ester, 5-norbornene-2-carboxylic acid, 5-norbornene-2-carboxylic acid methyl ester, 5-norbornene-2-carboxylic acid ethyl ester, 5-norbornene-2-carboxylic acid t-butyl ester, 5-norbornene-2-carboxylic acid i-butyl ester, 5-norbornene-2-carboxylic acid trimethyl silyl ester, 5-norbornene-2-carboxylic acid triethyl silyl ester, 5-norbornene-2-carboxylic acid isobonyl ester, 5-norbornene-2-carboxylic acid 2-hydroxyethyl ester, 5-norbornene-2-methyl-2-carboxylic acid methyl ester, cinnamic acid 5-norbornene-2-methyl ester, 5-norbornene-2-methyl ethyl carbonate, 5-norbornene-2-methyl n-butyl carbonate, 5-norbornene-2-methyl t-butyl carbonate, 5-methoxy-2-norbornene, (meth)acrylic acid 5-norbornene-2-methyl ester, (meth)acrylic acid 5-norbornene-2-ethyl ester, (meth)acrylic acid 5-norbornene-2-n-butyl ester, (meth)acrylic acid 5-norbornene-2-n-propyl ester, (meth)acrylic acid 5-norbornene-2-1-butyl ester, (meth)acrylic acid 5-norbornene-2-1-propyl ester, (meta)acrylic acid 5-norbornene-2-hexyl ester, (meta)acrylic acid 5-norbornene-2-octyl ester or (meth)acrylic acid 5-norbornene-2-decyl ester; the monomer having the epoxy group such as 5-[(2,3-epoxypropoxy) methyl]-2-norbornene]; the monomer composed of a tetracyclic ring such as 8-methoxycarbonyl tetracyclo[4.4.0.1$^{2,5}$.1$^{7,10}$]dodec-3-ene, 8-ethoxycarbonyl tetracyclo[4.4.0.1$^{2,5}$.1$^{7,10}$]dodec-3-ene, 8-n-propylcarbonyl tetracyclo[4.4.0.1$^{2,5}$.1$^{7,10}$]dodec-3-ene, 8-1-propylcarbonyl tetracyclo[4.4.0.1$^{2,5}$.1$^{7,10}$]dodec-3-ene, 8-n-butoxycarbonyl tetracyclo[4.4.0.1$^{2,5}$.1$^{7,10}$]dodec-3-ene, 8-(2-methyl propoxy)carbonyl tetracyclo[4.4.0.1$^{2,5}$.1$^{7,10}$]dodec-3-ene, 8-(1-methyl propoxy) carbonyl tetracyclo[4.4.0.1$^{2,5}$.1$^{7,10}$]dodec-3-ene, 8-t-butoxycarbonyl tetracyclo[4.4.0.1$^{2,5}$.1$^{7,10}$]dodec-3-ene, 8-cyclohexyloxycarbonyl tetracyclo[4.4.0.1$^{2,5}$.1$^{7,10}$]dodec-3-ene, 8-(4'-t-butyl cyclohexyloxy)carbonyl tetracyclo[4.4.0.1$^{2,5}$.1$^{7,10}$]dodec-3-ene, 8-phenoxycarbonyl tetracyclo[4.4.0.1$^{2,5}$.1$^{7,10}$]dodec-3-ene, 8-tetrahydrofuranyloxycarbonyl tetracyclo[4.4.0.1$^{2,5}$.1$^{7,10}$]-dodecene, 8-tetrahydropyranyloxycarbonyl tetracyclo[4.4.0.1$^{2,5}$.1$^{7,10}$]dodec-3-ene, 8-methyl-8-methoxycarbonyl tetracyclo[4.4.0.1$^{2,5}$.1$^{7,10}$]dodec-3-ene, 8-methyl-8-ethoxycarbonyl tetracyclo[4.4.0.1$^{2,5}$.1$^{7,10}$]dodec-3-ene, 8-methyl-8-n-propoxycarbonyl tetracyclo[4.4.0.1$^{2,5}$.1$^{7,10}$]dodec-3-ene, 8-methyl-8-isopropoxycarbonyl tetracyclo[4.4.0.1$^{2,5}$.1$^{7,10}$]dodec-3-ene, 8-methyl-8-n-butoxycarbonyl tetracyclo[4.4.0.1$^{2,5}$.1$^{7,10}$]dodec-3-ene, 8-methyl-8-(2-methyl propoxy)carbonyl tetracyclo[4.4.0.1$^{2,5}$.1$^{7,10}$]dodec-3-ene, 8-methyl-8-(1-methyl propoxy) carbonyl tetracyclo[4.4.0.1$^{2,5}$.1$^{7,10}$]dodec-3-ene, 8-methyl-8-t-butoxycarbonyl tetracyclo[4.4.0.1$^{2,5}$.1$^{7,10}$]dodec-3-ene, 8-methyl-8-cyclohexyloxycarbonyl tetracyclo[4.4.0.1$^{2,5}$.1$^{7,10}$]dodec-3-ene, 8-methyl-8-(4'-t-butyl cyclohexyloxy)carbonyl tetracyclo[4.4.0.1$^{2,5}$.1$^{7,10}$]dodec-3-ene, 8-methyl-8-phenoxycarbonyl tetracyclo[4.4.0.1$^{2,5}$.1$^{7,10}$]dodec-3-ene, 8-methyl-8-tetrahydrofuranyloxycarbonyl tetracyclo[4.4.0.1$^{2,5}$.1$^{7,10}$]dodec-3-ene, 8-methyl-8-tetrahydropyranyloxycarbonyl tetracyclo[4.4.0.1$^{2,5}$.1$^{7,10}$]-3-dodecene, 8-methyl-8-acetoxytetracyclo[4.4.0.1$^{2,5}$.1$^{7,10}$]dodec-3-ene, 8,9-di(methoxycarbonyl) tetracyclo[4.4.0.1$^{2,5}$.1$^{7,10}$]dodec-3-ene, 8,9-di(ethoxycarbonyl) tetracyclo[4.4.0.1$^{2,5}$.1$^{7,10}$]dodec-3-ene, 8,9-di(n-propoxycarbonyl) tetracyclo[4.4.0.1$^{2,5}$.1$^{7,10}$]dodec-3-ene, 8,9-di(isopropoxycarbonyl) tetracyclo[4.4.0.1$^{2,5}$.1$^{7,10}$]dodec-3-ene, 8,9-di(n-butoxycarbonyl) tetracyclo[4.4.0.1$^{2,5}$.1$^{7,10}$]dodec-3-ene, 8,9-di(t-butoxycarbonyl) tetracyclo[4.4.0.1$^{2,5}$.1$^{7,10}$]dodec-3-ene, 8,9-di (cyclohexyloxycarbonyl) tetracyclo[4.4.0.1$^{2,5}$.1$^{7,10}$]dodec-3-ene, 8,9-di(phenoxyloxycarbonyl) tetracyclo[4.4.0.1$^{2,5}$.1$^{7,10}$]dodec-3-ene, 8,9-di(tetrahydrofuranyloxycarbonyl) tetracyclo[4.4.0.1$^{2,5}$.1$^{7,10}$]dodec-3-ene, 8,9-di(tetrahydropyranyloxycarbonyl) tetracyclo[4.4.0.1$^{2,5}$.1$^{7,10}$]dodec-3-ene, 8,9-tetracyclo[4.4.0.1$^{2,5}$.1$^{7,10}$]dodec-3-ene, tetracyclo[4.4.0.1$^{2,5}$.1$^{7,10}$]dodec-3-ene-8-carboxylic acid, 8-methyl tetracyclo[4.4.0.1$^{2,5}$.1$^{7,10}$]dodec-3-ene-8-carboxylic acid, 8-methyl tetracyclo[4.4.0.1$^{2,5}$.1$^{7,10}$]dodec-3-ene, 8-ethyl tetracyclo[4.4.0.1$^{2,5}$.1$^{7,10}$]dodec-3-ene, 8-methyl tetracyclo[4.4.0.1$^{2,5}$.1$^{1,6}$]dodec-3-ene, 8-ethylidene tetracyclo[4.4.0.1$^{2,5}$.1$^{7,12}$]dodec-3-ene, 8-ethylidene tetracyclo[4.4.0.1$^{2,5}$.1$^{7,10}$.0$^{1,6}$]dodec-3-ene; and the like.

In general, the cyclic olefin resin having the epoxy group is preferably an addition (co)polymer obtained by addition (co)polymerizing the norbornene type monomer, as represented by the following formula 2.

[Formula 2]

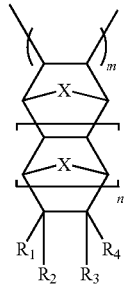

(2)

wherein "X" is any one of O, CH$_2$ and (CH$_2$)$_2$, "n" is an integer of 0 to 5, and "m" is an integer of 10 to 10,000. Each of R$_1$ to R$_4$ is a hydrogen atom, an alkyl group, an alkenyl group, an alkynyl group, an allyl group, an aryl group, an aralkyl group, a functional group containing an ester group, a functional group containing a ketone group, a functional group containing an ether group or a functional group containing an epoxy group. In repeating units of the cyclic olefin resin having the epoxy group, R$_1$s to R$_4$s may be different from each other, but at least one of R$_1$s to R$_4$s in all the repeating units is the functional group having the epoxy group.

As the cyclic olefin resin (A) having the epoxy group, polymers represented by the following formulas (3) and (4) are preferably used in view of polymer properties (e.g., low elastic modulus, high elongation, low water absorption) after being cured. By introducing the norbornene monomer having the aralkyl group into the polymer as represented by the formula (4), it becomes possible to improve solubility of the polymer in a polar solvent such as cyclopentanone or heptanone which is used as a solvent for preparing a negative type developing solution. Such a polymer has an advantage that it is easy to be handled.

[Formula 3]

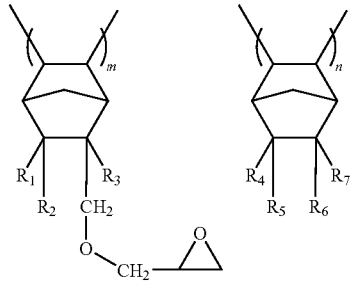

(3)

wherein each of "m" and "n" is an integer of 1 or more. Each of R$_1$ to R$_7$ is a hydrogen atom, an alkyl group, an alkenyl group, an alkynyl group, an allyl group, an aryl group, an aralkyl group, a functional group containing an ester group, a functional group containing a ketone group or a functional group containing an ether group. In repeating units of the cyclic olefin resin having the epoxy group, $R_1$s to $R_7$s may be different from each other.

[Formula 4]

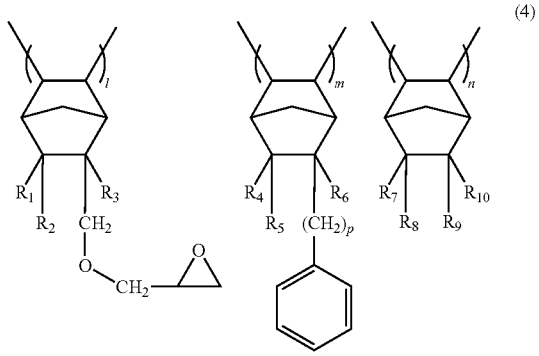

(4)

wherein each of "l", "m" and "n" is an integer of 1 or more, and "p" is an integer of 0 to 5. Each of $R_1$ to $R_{10}$ is a hydrogen atom, an alkyl group, an alkenyl group, an alkynyl group, an allyl group, an aryl group, an aralkyl group, a functional group containing an ester group, a functional group containing a ketone group or a functional group containing an ether group. In repeating units of the cyclic olefin resin having the epoxy group, $R_1$s to $R_{10}$s may be different from each other.

As the cyclic olefin resin having the epoxy group, a polymer represented by the following formula (5) is more preferably used in view of the polymer properties after being cured. By introducing the norbornene monomer having the decyl group into the polymer, it is possible to obtain a resin layer (film) having low elastic modulus. Further, by introducing the norbornene monomer having the phenyl ethyl group into the polymer, it is possible to obtain a resin layer (film) having a low water-absorbing property and excellent chemical resistance and solubility in a polar solvent.

[Formula 5]

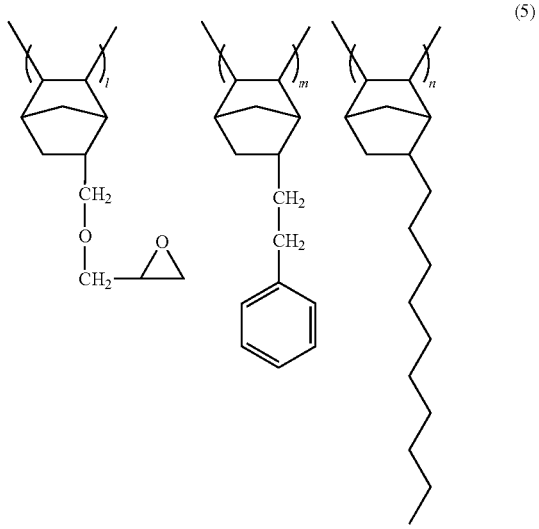

(5)

wherein each of "l", "m" and "n" is an integer of 1 or more.

An amount of the monomer having the epoxy group contained in the copolymer is determined based on whether the copolymer can be cross-linked by exposure and a cross-link density capable of resistance to developer can be obtained. The amount of the monomer having the epoxy group contained in the copolymer is in the range of 5 to 95 mol %, preferably in the range of 20 to 80 mol %, and more preferably in the range of 30 to 70 mol %. The copolymer thus obtained exhibits excellent physical properties such as a low water absorption property (<0.3 wt %), low dielectric constant (<2.6), low dielectric loss (0.001), and a glass transition temperature (170 to 400° C.)

It is preferred that a resin layer formed of such a resin composition having the constitution B can be patterned by irradiation of light. This makes it possible to provide the resin layer at a necessary portion in a precise and cost-effective manner.

In order to enable the resin layer to be patterned by the irradiation of light, the resin composition having the constitution B preferably contains a photo-acid generator, a sensitizer, an acid scavenger and the like.

As the photo-acid generator, all compounds known as a photo-acid generator can be used. The photo-acid generator cross-links the epoxy groups and increases an adhesion property of the resin layer to a substrate after curing. Preferable examples of the photo-acid generator include an onium salt, a halogen compound, a sulfate salt and a mixture thereof. Examples of the onium salt include a diazonium salt, an ammonium salt, an iodonium salt, a sulfonium salt, a phosphonium salt, an arsonium salt, an oxonium salt and the like. As long as a compound can produce a counter anion together with the above onium salt, the counter anion is not limited to a specific type. Examples of the counter anion include, but are not particularly limited to, boric acid, arsonium acid, phosphoric acid, antimonic acid, a sulfate salt, and carboxylic acid and chloride thereof. Examples of the photo-acid generator composed of the onium salt include triphenyl sulfonium tetrafluoroborate, triphenyl sulfonium hexafluoroborate, triphenyl sulfonium tetrafluoroarsenate, triphenyl sulfonium tetrafluorophosphate, triphenyl sulfonium tetrafluorosulfate, 4-thiophenoxydiphenyl sulfonium tetrafluoroborate, 4-thiophenoxydiphenyl sulfonium tetrafluoroantimonate, 4-thiophenoxydiphenyl sulfonium tetrafluoroarsenate, 4-thiophenoxydiphenyl sulfonium tetrafluorophosphate, 4-thiophenoxydiphenyl sulfonium tetrafluorosulfonate, 4-t-butyl phenyl diphenyl sulfonium tetrafluoroborate, 4-t-butyl phenyl diphenyl sulfonium tetrafluorosulfonate, 4-t-butyl phenyl diphenyl sulfonium tetrafluoroantimonate, 4-t-butyl phenyl diphenyl sulfonium trifluorophosphonate, 4-t-butyl phenyl diphenyl sulfonium trifluorosulfonate, tris(4-methyl phenyl) sulfonium trifluoroborate, tris(4-methyl phenyl) sulfonium tetrafluoroborate, tris(4-methyl phenyl) sulfonium hexafluoroarsenate, tris(4-methyl phenyl) sulfonium hexafluorophosphate, tris(4-methyl phenyl) sulfonium hexafluorosulfonate, tris(4-methoxyphenyl) sulfonium tetrafluoroborate, tris(4-methyl phenyl) sulfonium hexafluoroantimonate, tris(4-methyl phenyl) sulfonium hexafluorophosphonate, tris(4-methyl phenyl) sulfonium trifluorosulfonate, triphenyl iodonium tetrafluoroborate, triphenyl iodonium hexafluoroantimonate, triphenyl iodonium hexafluoroarsenate, triphenyl iodonium hexafluorophosphonate, triphenyl iodonium trifluorosulfonate, 3,3-dinitrodiphenyl iodonium tetrafluoroborate, 3,3-dinitrodiphenyl iodonium hexafluoroantimonate, 3,3-dinitrodiphenyl iodonium hexafluoroarsenate, 3,3-dinitrodiphenyl iodonium trifluorosulfonate, 4,4-dinitrodiphenyl iodonium tetrafluoroborate, 4,4-dinitrodiphenyl iodonium hexafluoroantimonate, 4,4-dinitrodiphenyl iodonium hexafluoroarsenate, and 4,4- dinitrodiphenyl iodonium trifluorosulfonate. These photo-acid generators may be used alone or in a mixture of two or more.

Examples of a photo-acid generator containing a halogen atom include 2,4,6-tris(trichloromethyl) triazine, 2-allyl-4,6-bis(trichloromethyl) triazine, α,β,α-tribromomethyl phenyl sulfone, α,α-2,3,5,6-hexachloroxylene, 2,2-bis(3,5-dibromo-4-hydroxyphenyl)-1,1,1,3,3,3-hexafluoroxylene, 1,1,1-tris(3,5-dibromo-4-hydroxyphenyl) ethane, and a mixture thereof.

Examples of a sulfonate photo-acid generator include, but are not particularly limited to, 2-nitrobenzyl tosylate, 2,6-dinitrobenzyl tosylate, 2,4-dinitrobenzyl tosylate, 2-nitrobenzyl methyl sulfonate, 2-nitrobenzyl acetate, 9,10-dimethoxyanthracene-2-sulfonate, 1,2,3-tris (methanesulfonyloxy)benzene, 1,2,3-tris (ethanesulfonyloxy)benzene, 1,2,3-tris (propanesulfonyloxy)benzene and the like.

Preferable examples of the photo-acid generator include 4,4'-di-t-butyl phenyl iodonium triflate, 4,4', 4''-tris(t-butyl phenyl) sulphonium triflate, diphenyl iodonium tetrakis(pentafluorophenyl) borate, triphenyl sulfonium diphenyl iodonium tetrakis(pentafluorophenyl) borate, 4,4'-di-t-butyl phenyl iodonium tetrakis(pentafluorophenyl) borate, tris(t-butyl phenyl) sulphonium tetrakis(pentafluorophenyl) borate, (4-methyl phenyl-4-(1-methyl ethyl) phenyl iodonium tetrakis(pentafluorophenyl) borate, and a mixture thereof.

In the present invention, An amount of the photo-acid generator contained in the resin composition is in the range of 0.1 to 100 parts by weight, and preferably in the range of 0.1 to 10 parts by weight, with respect to 100 parts by weight of the cyclic olefin resin.

The sensitizer can extend a wavelength range capable of activating the photo-acid generator, and can be added to the resin composition in such an amount that the cross-linking reaction of the polymer is not directly influenced by the sensitizer. A compound having a maximum light absorption coefficient corresponding to a wavelength of a used light source and capable of efficiently transferring absorbed energy to the photo-acid generator can be used as a photo-sensitizer. The sensitizer for the photo-acid generator is a cyclic aromatic compound such as anthracene, pyrene or parylene. Examples thereof include 2-isopropyl-9H-thioxanthen-9-ene, 4-isopropyl-9H-thioxanthen-9-one, 1-chloro-4-propoxythioxanthene, phenothiazine, and a mixture thereof. An amount of the photo-acid generator contained in the resin composition in the present invention is in the range of 0.1 to 10 parts by weight, and preferably in the range of 0.2 to 5 parts by weight, with respect to 100 parts by weight of the cyclic olefin resin. In the case where the light source emits light having a long wavelength such as a "g" line (436 nm) and an "i" line (365 nm), the sensitizer is effective for activating the photo-acid generator.

The acid scavenger has the effect of enhancing the resolution of the resin layer formed of the resin composition. The acid scavenger absorbs acids diffused to unexposed portions during a photochemical reaction. Examples of the acid scavenger include, but are not particularly limited to, a secondary or tertiary amine such as pyridine, lutidine, phenothiazine, tri-n-propyl amine or triethyl amine. An amount of the acid scavenger contained in the resin composition is in the range of 0.1 to 0.05 parts by weight, with respect to 100 parts by weight of the cyclic olefin resin.

In the present invention, the resin composition having the constitution B may contain additives such as a leveling agent, an antioxidant, a fire retardant, a plasticizer and a silane coupling agent, if needed.

Using such a resin composition having the constitution B, a film for through-hole filling material can be produced in the same manner as the resin composition having the constitution A. The film for through-hole filling material can fill the through-hole 1 provided through the semiconductor element 100 (semiconductor substrate 10) by laminating the film on the semiconductor element 100. Thereafter, by thermally curing the film for through-hole filling material, it is possible to obtain a through-hole filling material (a filling material of the present invention).

Further, the above resin composition having the constitution A or B also may be applied in a varnish state to the semiconductor element 100 (semiconductor substrate 10) provided with the through-hole 1, and then cured, thereby obtaining a through-hole filling material (a filling material of the present invention).

Hereinafter, an insulating layer will be described.

Figure 2:
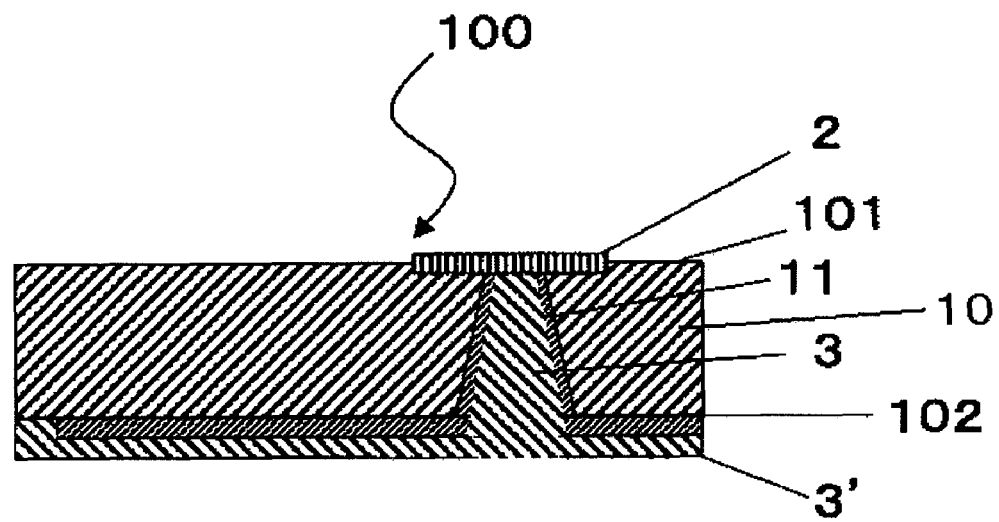
FIG. 2 is a vertical section view showing the semiconductor element in a state that the through-hole is filled with a through-hole filling material.

As shown in FIG. 2, the above film for through-hole filling material is attached to the semiconductor substrate 10 so as to fill the through-hole 1 and cover the surface 102 opposite to the functional surface 101 thereof, and then cured. In this way, it is possible to form an insulating layer (through-hole filling material) including a layer-shaped insulating portion 3' provided on the opposite surface 102 and a filling portion 3 formed integrally with the insulating portion 3' and filling the through-hole 1. By forming such an insulating layer, it is possible to protect the conductive material 11 provided in the through-hole 1 while protecting a rerouting circuit provided on the surface 102 opposite to the functional surface 101 of the semiconductor substrate 10.

Figure 3:
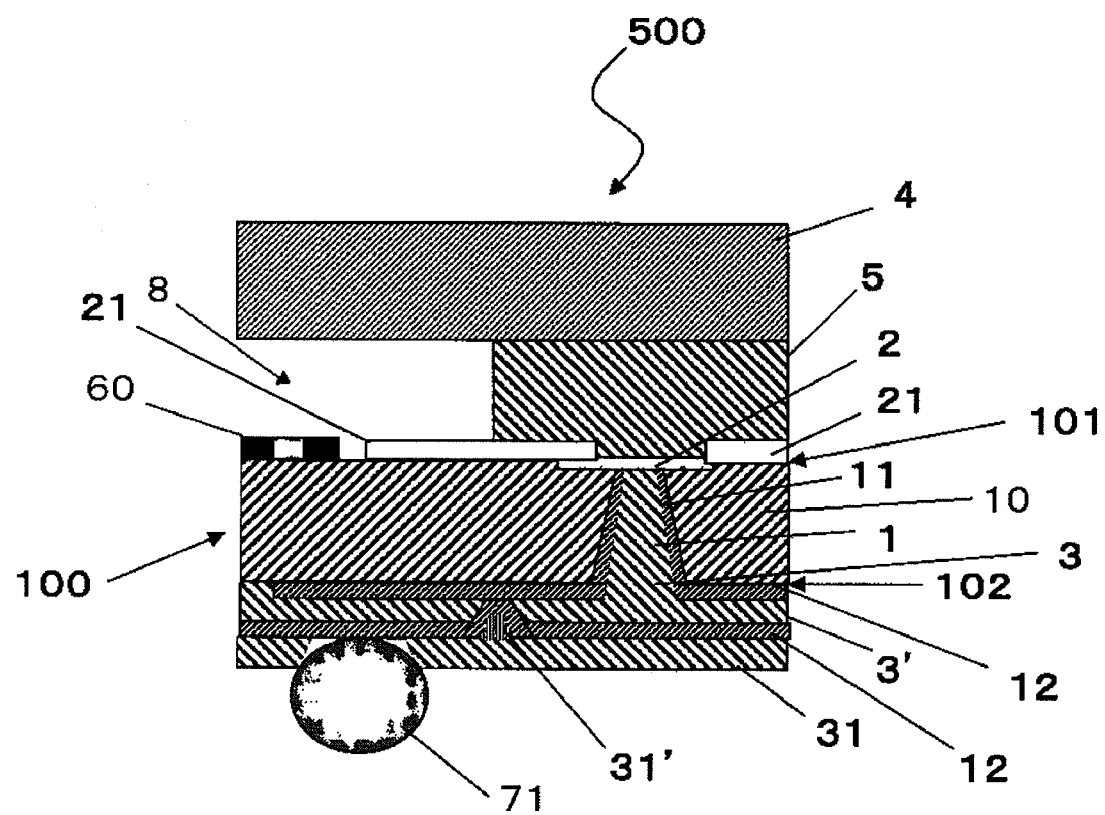
FIG. 3 is a vertical section view showing a part of a semiconductor device of a first embodiment.

Further, in the case where the film for through-hole filling material is formed of the above resin composition which can be patterned by the irradiation of light (e.g., the resin composition having the constitution A which is composed of: the resin having the radical-polymerizable double bond; the thermosetting resin; and the resin having the alkali-soluble group and the double bond), the film can be patterned by the irradiation of light. Therefore, in this case, it is possible to form a given circuit pattern without using a resist material by patterning the film for through-hole filling material to a predetermined pattern before being cured. For example, when the film for through-hole filling material is selectively irradiated with light through a photo-mask, the photo-curable resin contained in the resin composition constituting the irradiated portion thereof is photo-cured. Therefore, by developing the film for through-hole filling material with a developing solution (e.g., an alkali aqueous solution or an organic solvent) after being irradiated with the light (after being exposed with the light), it is possible to remain only the light-irradiated portion without being developed with the developing solution, thereby precisely patterning (remaining) the film for through-hole filling material in a desired shape. In this way, in the resulting insulating layer, an opening 31' as shown in FIG. 3 can be formed.

A thickness of the insulating portion 3' is not particularly limited to a specific value, but is preferably in the range of 10 to 60 μm, and more preferably in the range of 15 to 55 μm. By setting the thickness of the insulating portion 3' to fall within the above range, the semiconductor element 100 exhibits particularly excellent reliability in a thermal cycle test or a reflow resistance test.

Hereinafter, a semiconductor device of the present invention will be described.

First, a first embodiment of the semiconductor device of the present invention will be described.

FIG. 3 is a vertical section view showing a part of the semiconductor device of the first embodiment.

As shown in FIG. 3, in the semiconductor device 500, the above semiconductor element 100 and a transparent substrate 4 are bonded together through a spacer 5.

A microlens 60 is mounted on a central portion of the functional surface 101 of the semiconductor substrate 10 included in the semiconductor element 100. The microlens 60 receives light energy passed through the transparent substrate 4 and transmits the energy to the semiconductor element 100. A protective film 21 is formed on a portion of the functional surface 101 of the semiconductor substrate 10 other than a portion on which the microlens 60 is provided.

Since the semiconductor element 100 and the transparent substrate 4 are bonded together through the spacer 5 along outer circumferential portions thereof, a space (cavity) 8 is formed at an upper side (transparent substrate side) of the microlens 60. This makes it possible to prevent dust from adhering to the microlens 60 in process of manufacturing the semiconductor device 500.

As described above, the semiconductor substrate 10 has the through-hole 1 in which the conductive material 11 is provided. A circuit wiring 12 is provided on the surface 102 opposite to the functional surface 101 of the semiconductor substrate 10. Further, an inner circumferential surface defining the through-hole 1 and the surface 102 of the semiconductor substrate 10 are subjected to an insulating in order to maintain an insulation condition for the conductive material 11 and the circuit wiring 12. Examples of such an insulating include: an oxidation treatment of selectively oxidizing the surface of the semiconductor substrate 10 such as a thermal treatment or an oxygen plasma treatment; a treatment of forming an insulating layer with a resin material as described below on a second embodiment of the present invention; and the like.

Inside of the conductive material 11 is filled with the filling portion 3. Further, the circuit wiring 12 is covered with the layer-shaped insulating portion 3' formed integrally with the filling portion 3. In this embodiment, the insulating layer consists of the filling portion 3 and the insulating portion 3'.

In this regard, it is to be noted that the insulating layer may consist of the filling portion 3 which fills the through-hole 1 alone by, if needed, omitting the insulating portion 3' in the present invention. In this case, the filling portion 3 becomes the filling material of the present invention.

In this embodiment, since such an insulating layer is formed using the film for through-hole filling material formed of the above resin composition which can be patterned by the irradiation of light, an opening can be formed using a photolithography method. Namely, the film for through-hole filling material is patterned before being cured, as a result of which an opening 31' is formed through the insulating portion 3' of the insulating layer. A circuit wiring 12 is provided in the opening 31' and on a surface of the insulating layer opposite to the semiconductor substrate 10.

In addition, an insulating layer 31 is further provided on a lower side of the circuit wiring 12 (lower side in FIG. 3). Further, an opening in which a soldering bump 71 is provided is formed through the insulating layer 31.

Furthermore, a resin composition constituting the spacer 5 may be the same as or different from the resin composition constituting the insulating layer (the filling portion 3 and the insulating portion 3'), but they are preferably the same. This makes it possible to suppress occurrence of warpage of the semiconductor device 500.

Thus, the resin composition constituting the spacer 5 preferably includes: the above resin composition having the constitution A which is composed of the resin having the radical-polymerizable double bond, the thermosetting resin, and the resin which differs from the resin having the radical-polymerizable double bond and has the alkali-soluble group and the double bond; the above resin composition having the constitution B which is composed of the cyclic olefin resin; or the mixture thereof.

Further, the insulating layer 31 is also preferably formed of the same resin composition as the above resin composition constituting the insulating layer (the filling portion 3 and the insulating portion 3'), but is not limited thereto. This makes it possible to form an opening through the insulating layer 31 using the photolithography method.

Hereinafter, a second embodiment of the semiconductor device of the present invention will be described.

Figure 4:
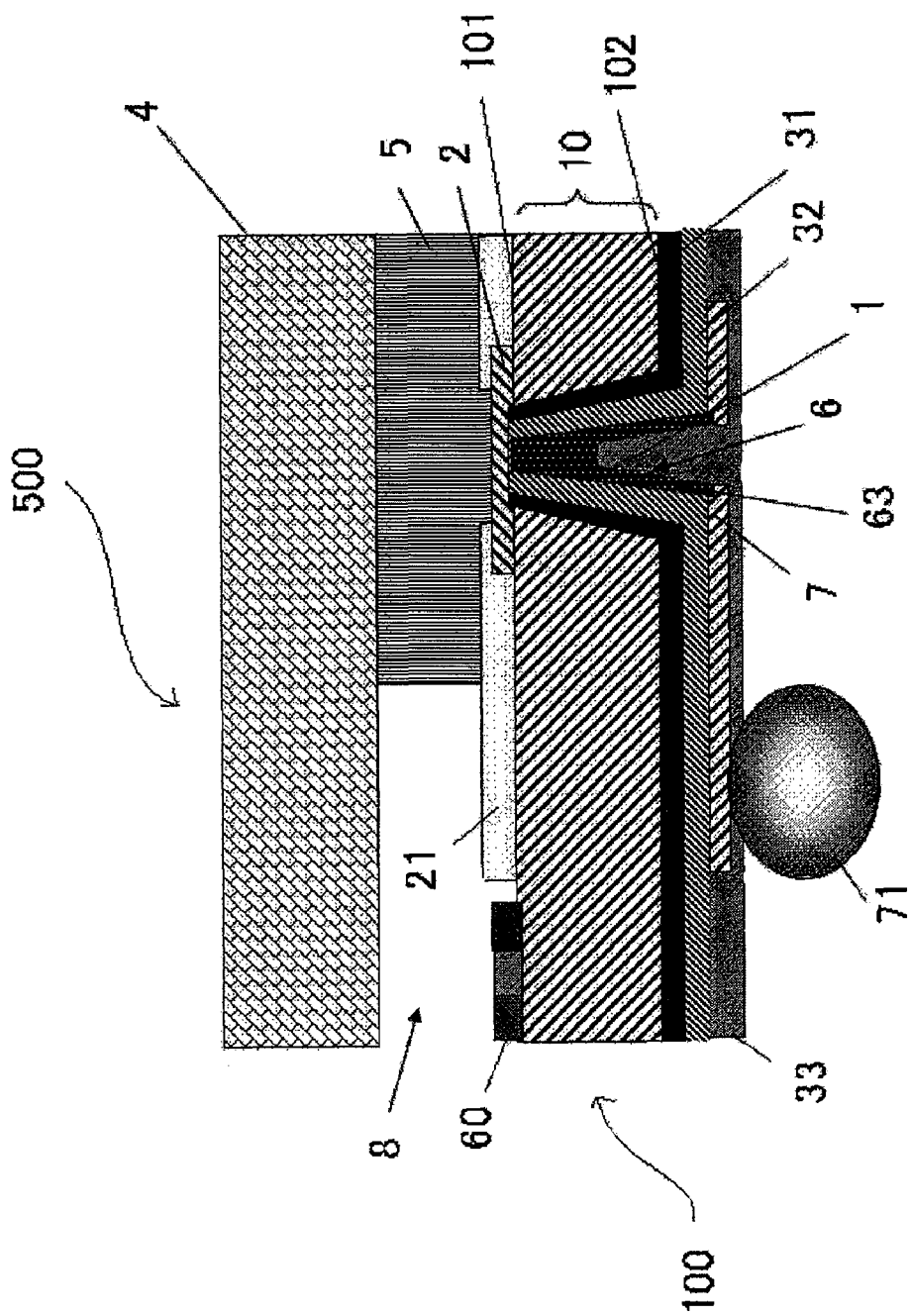
FIG. 4 is a vertical section view showing a part of a semiconductor device of a second embodiment.

FIG. 4 is a vertical section view showing a part of the semiconductor device of the second embodiment.

In the following description of the semiconductor device according to the second embodiment, differences thereof from the semiconductor device of the first embodiment will be mainly described, and similar portions will be suitably omitted.

As shown in FIG. 4, the semiconductor device 500 comprises a semiconductor element 100 including a semiconductor substrate 10, a transparent substrate (glass substrate) 4, and a spacer (frame material) 5 provided so as to form a space (cavity) 8 between the semiconductor substrate 10 and the transparent substrate 4.

A through-hole 1 is formed so as to extend through the semiconductor substrate 10 in a thickness direction thereof, and a penetrating electrode (conductive portion) 6 is provided in the through-hole 1.

The penetrating electrode 6 is provided so as to pass through not only a first resin layer 31 formed so as to cover an inner surface defined by the through-hole 1 formed through the semiconductor substrate 10 and one surface 102 (opposite to a functional surface 101), but also a second resin layer 32 applied to the first resin layer 31. Further, the penetrating electrode 6 is electrically connected to a terminal 2 of a wiring pattern provided on the functional surface (the other surface) 101 of the semiconductor substrate 10.

On the other hand, a wiring pattern 7 is formed on a surface of the second resin layer 32 opposite to the first resin layer 31 (lower surface in FIG. 4) and electrically connected to the penetrating electrode 6. Further, a third resin layer (solder resist layer) 33 is formed so as to cover the penetrating electrode 6 and the wiring pattern 7. A soldering bump 71 is formed on a portion of the wiring pattern 7 so as to pass through the third resin layer 33.

In this embodiment, the insulating layer consists of the first resin layer 31, the second resin layer 32 and the third resin layer 33.

As described above, the first resin layer 31 is formed so as to cover the inner surface defining the through-hole 1 and the one surface 102 of the semiconductor substrate 10 (lower surface in FIG. 4).

Further, the second resin layer 32 is provided so as to be applied to the first resin layer 31.

This semiconductor device 500 of the present invention is characterized in that an elastic modulus of the first resin layer 31 is lower than that of the second resin layer 32. This makes it possible for the first resin layer 31 to relieve stress which would be generated when the second resin layer 32 is cured, thereby suppressing occurrence of warpage of the semiconductor device 500.

The elastic modulus of the first resin layer 31 is not particularly limited to a specific value, but is preferably 2,500 MPa or lower, more preferably 2,000 MPa or lower, and even mpre preferably in the range of 1,000 to 1,800 MPa. By setting the elastic modulus of the first resin layer 31 to fall within the above range, the first resin layer 31 can have an excellent function of absorbing the stress which would be generated when the second resin layer 32 is cured.

The first resin layer 31 is preferably patterned by irradiation of light, but is not limited thereto. This makes it possible to provide the first resin layer 31 at a necessary portion in a precise and cost-effective manner.

Further, the elastic modulus of the second resin layer 32 is not particularly limited to a specific value, but is preferably 3,500 MPa or higher, more preferably 4,000 MPa or higher, and even more preferably in the range of 4,500 to 5,500 MPa. By setting the elastic modulus of the second resin layer 32 to fall within the above range, it is possible to obtain a semiconductor device 500 having a high insulating property and excellent reliability. This is because since the second resin layer 32 having the elastic modulus of the above range has need to be formed of a resin having a low coefficient of thermal expansion and high heat resistance, it is possible to reduce damage to a sidewall defining a through-hole in process of forming the through-hole using laser (that is, it is possible to impart laser processability to the second resin layer 32).

Further, a coefficient of thermal expansion of the second resin layer 32 at a glass transition temperature or lower temperature is not particularly limited to a specific value, but is preferably 100 ppm or less, more preferably 80 ppm or less, and even more preferably in the range of 20 to 60 ppm. By setting the coefficient of thermal expansion of the second resin layer 32 at the glass transition temperature or lower temperature to fall within the above range, it is possible to decrease expansion and contraction of the second resin layer 32 due to heat in each process of manufacturing the semiconductor device 500. This makes it possible to decrease difference in expansion and contraction between the semiconductor substrate 10 and the second resin layer 32, thereby further suppressing the occurrence of the warpage of the semiconductor device 500. In addition, it is also possible to obtain a semiconductor device 500 having high reliability while improving a yield in the subsequent processes.

In the case where the elastic modulus of the first resin layer 31 is defined as "A" and the elastic modulus of the second resin layer 32 is defined as "B", a ratio of the elastic moduluses (A/B) is not particularly limited to a specific value, but is preferably in the range of 0.2 to 0.8, and more preferably in the range of 0.2 to 0.5. By setting the ratio of the elastic moduluses to fall within the above range, it is possible for the second resin layer 32 to have excellent reliability while suppressing the occurrence of the warpage of the semiconductor device 500. In addition, since the second resin layer 32 can have excellent laser processability, it is also possible to obtain a semiconductor device 500 having high reliability.

Next, the first resin layer 31, the second resin layer 32 and the third resin layer 33 will be described in further detail.

(First Resin Layer 31)

The first resin layer 31 is formed of a first resin composition which is the same as the above resin composition, that is, the resin composition having the constitution A which is composed of the resin having the radical-polymerizable double bond, the thermosetting resin, and the resin which differs from the resin having the radical-polymerizable double bond and has the alkali-soluble group and the double bond; the resin composition having the constitution B which is composed of the cyclic olefin resin; or the mixture thereof.

The inner surface defining the through-hole 1 and the one surface of the semiconductor substrate 10 can be covered with the above first resin composition using one of methods such as 1) a method of applying the first resin composition in a varnish state thereto and drying the same, and 2) a method of laminating the first resin composition in a film state thereon. Thereafter, a part of the first resin layer 31 is selectively removed using a photolithography method or the like, to thereby expose the terminal 2 from the first resin layer 31.

In this regard, the first resin layer 31 is formed of a material having low heat resistance as compared with the second resin layer 32 which will be described below. However, since the photolithography method can be used in order to expose the terminal 2, the first resin layer 31 does not need to be heated like the case of using laser processing. Therefore, it is possible to remove a part of the first resin layer 31 without causing alteration and deterioration of the first resin layer 31 near the exposed terminal 2.

(Second Resin Layer 32)

The second resin layer 32 is formed of, for example, a second resin composition comprising a curable resin, a curing agent and the like.

Examples of the curable resin include: phenol resin such as novolak type phenol resin (e.g., phenol novolak resin, cresol novolak resin, bisphenol A nobolak resin) or resol type phenol resin (e.g., unmodified resol phenol resin, oil-modified resol phenol resin modified by tung oil, linseed oil or walnut oil); epoxy resin such as bisphenol type epoxy resin (e.g., bisphenol A type epoxy resin, bisphenol F type epoxy resin, bisphenol S type epoxy resin, bisphenol E type epoxy resin, bisphenol M type epoxy resin, bisphenol P type epoxy resin, bisphenol Z type epoxy resin), novolak type epoxy resin (e.g., phenol novolak type epoxy resin, cresol novolak type epoxy resin), biphenyl type epoxy resin, biphenyl aralkyl type epoxy resin, aryl alkylene type epoxy resin, naphthalene type epoxy resin, anthracene type epoxy resin, phenoxy type epoxy resin, dicyclopentadiene type epoxy resin, norbornene type epoxy resin, adamantane type epoxy resin or fluorene type epoxy resin; urea resin; triazine ring containing resin such as melamine resin; unsaturated polyester resin; bismaleimide resin; polyurethane resin; diallyl phthalate resin; silicone resin; benzooxazine ring containing resin; cyanate resin; polyimide resin; polyamideimide resin; benzocyclobutene resin; and the like. These resins may be used alone or in a mixture of two or more having different weight-average molecular weights. Further, one or more resins may be mixed with prepolymers thereof.

Among them, the cyanate resin (including a prepolymer of the cyanate resin) is more preferably used. By using the cyanate resin, it is possible to further lower the coefficient of thermal expansion of the second resin layer 32. Further, the second resin layer 32 can have an excellent electrical property (e.g., low dielectric constant, low dielectric tangent) and the like.

For example, the cyanate resin can be obtained by reacting a halogenated cyan compound with phenol to produce a reactant, and then, if needed, pre-polymerizing the reactant using a thermal treatment or the like. Specific examples of the cyanate resin include novolak type cyanate resin, bisphenol type cyanate resin such as bisphenol A type cyanate resin, bisphenol E type cyanate resin or tetramethyl bisphenol F type cyanate resin, and the like. Among them, the novolak type cyanate resin is preferably used. This makes it possible to improve heat resistance of the second resin layer 32 due to increase of a cross-linking density of the novolak type cyanate resin, and to improve flammability of the second resin composition and the like. This is because the novolak type cyanate resin forms a triazine ring after being cured. Furthermore, this is believed to be because the novolak type cyanate resin has a high ratio of a benzene ring in a chemical structure thereof and is likely to be carbonized. Moreover, even in the case where the second resin layer 32 is formed so as to have a thin thickness of 35 μm or less, it is possible to impart excellent rigidity to the second resin layer 32. Particularly, since the second resin layer 32 has excellent rigidity even when being heated, it can exhibit excellent reliability in the case where the wiring pattern 7 is formed to the second resin layer 32.

As the novolak type cyanate resin, it is possible to use one represented by, for example, the following formula (6).

[Formula 6]

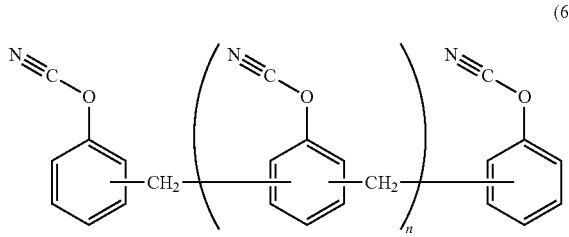

(6)

when "n" is an optional integer.

An average repeating unit number "n" of the novolak type cyanate resin represented by the above formula (6) is not particularly limited to a specific value, but is preferably in the range of 1 to 10, and more preferably in the range of 2 to 7. If the average repeating unit number "n" is less than the lower limit value of the above range, there is a case that heat resistance of the novolak type cyanate resin is lowered, thereby removing or vaporizing low weight molecules thereof when the second resin layer 32 is heated. On the other hand, if the average repeating unit number "n" exceeds the upper limit value of the above range, there is a case that it becomes difficult to form the second resin layer 32 due to excessive increase of a melt viscosity of the novolak type cyanate resin.

A weight-average molecular weight of the cyante resin is not particularly limited to a specific value, but is preferably in the range of 500 to 4,500, and more preferably in the range of 600 to 3,000. If the weight-average molecular weight is less than the lower limit value of the above range, the formed second resin layers 32 become tacky. For this reason, there is a case that the second resin layers 32 adhere to each other or the second resin composition constituting one of the second resin layers 32 is transferred to the other second resin layer 32 when they make contact with each other. On the other hand, if the weight-average molecular weight exceeds the upper limit value of the above range, there is a case that formation failure of the second resin layer 32 occurs or interlayer peel strength thereof is lowered in a process of manufacturing the semiconductor element 100, due to excessive increase of a reaction rate of the cyanate resin.

The weight-average molecular weight of the cyanate resin can be measured, for example, using a gel permeation chromatography (polystyrene standards).

The cyanate resins may be used alone or in a mixture of two or more having different weight-average molecular weights. Further, one or more cyanate resins may be mixed with prepolymers thereof. However, the use of the cyanate resins is not particularly limited thereto.

An amount of the thermosetting resin contained in the second resin composition is not particularly limited to a specific value, but is preferably in the range of 5 to 50 wt %, and more preferably in the range of 20 to 40 wt %, based on a total amount of the second resin composition. If the amount of the thermosetting resin is less than the lower limit value of the above range, there is a case that it becomes difficult to form the second resin layer 32. On the other hand, if it exceeds the upper limit value of the above range, there is a case that strength of the second resin layer 32 is lowered.

Further, the second resin composition preferably contains an inorganic filler. In this case, even in the case where the semiconductor element 100 is manufactured so as to have a thin thickness of 0.5 mm or less, it can have excellent strength. Furthermore, in this case, it is also possible to improve a low thermal expansion property of the semiconductor element 100.

Examples of the inorganic filler include: silicates such as talc, calcined clay, uncalcined clay, mica and glass; oxides such as titanium oxide, alumina, silica and fused silica; carbonates such as calcium carbonate, calcium magnesium and hydrotalsite; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanates such as strontium titanate and barium titanate. These inorganic fillers may be used alone or in a mixture of two or more. Among them, the silica is preferably used, and the fused silica (particularly spherical fused silica) is more preferably used. This is because the addition of such an inorganic filler to the second resin composition makes it possible to impart low thermal expansion property to the second resin layer 32. A shape of the silica may be preferably a crushed shape or a spherical shape. However, in the case where it is required that the melt viscosity of the second resin composition is lowered in order to ensure formability thereof, spherical silica is more preferably used. Namely, the type of the inorganic filler is selected depending on properties of the second resin composition to be imparted.

An average particle size of particles of the inorganic filler is not particularly limited to a specific value, but is preferably in the range of 0.01 to 5.0 μm, and more preferably in the range of 0.1 to 2.0 μm. If the particle size of the particles of the inorganic filler is smaller than the lower limit value of the above range, there is a case that workability in the formation of the second resin layer 32 is lowered due to increase of a viscosity of a varnish containing the second resin composition. On the other hand, if it exceeds the upper limit value of the above range, there is a case that precipitation or the like of the inorganic filler in the prepared varnish occurs.

The average particle size can be measured by a particle size analyzer ("LA-500" produced by HORIBA Ltd.).

Further, as the inorganic filler, an inorganic filler having a monodisperse particle size distribution or an inorganic filler having a polydisperse particle size distribution may be used. Furthermore, in the present invention, the inorganic filler having the monodisperse particle size distribution or the inorganic filler having the polydisperse particle size distribution may be used alone or in a mixture of two or more.

Furthermore, spherical silica (particularly spherical fused silica) composed of particles having an average particle size of 5.0 μm or smaller is preferably used, and spherical fused silica composed of particles having an average particle size of 0.01 to 2.0 μm is more preferably used. This makes it possible to improve a filling property (dispersibility) of the inorganic filler in the second resin layer 32.

An amount of the inorganic filler contained in the second resin composition is not particularly limited to a specific value, but is preferably in the range of 20 to 80 wt %, and more preferably in the range of 30 to 70 wt %, based on the total amount of the second resin composition. By setting the amount of the inorganic filler to fall within the above range, it is possible to impart low thermal expansion and low water absorption to the second resin layer 32.

In the case where the cyanate resin (particularly, novolak type cyanate resin) is used as the thermosetting resin, it is preferred that an epoxy resin (containing substantially no halogen atom) is used in combination with the cyanate resin. Examples of the epoxy resin include: bisphenol type epoxy resin such as bisphenol A type epoxy resin, bisphenol F type epoxy resin, bisphenol E type epoxy resin, bisphenol S type epoxy resin, bisphenol M type epoxy resin, bisphenol P type epoxy resin or bisphenol Z type epoxy resin; novolak type epoxy resin such as phenol novolak type epoxy resin or cresol novolak type epoxy resin; biphenyl type epoxy resin; xylene type epoxy resin; aryl alkylene type epoxy resin such as biphenyl aralkyl epoxy resin; naphthalene type epoxy resin; anthracene type epoxy resin; phenoxy type epoxy resin; dicyclopentadiene type epoxy resin; norbornene type epoxy resin; adamantane type epoxy resin; fluorine type epoxy resin; and the like. These epoxy resins may be used alone or in a mixture of two or more having different weight-average molecular weights. Further, one or more epoxy resins may be mixed with prepolymers thereof.

Among these epoxy resins, the aryl alkylene type epoxy resin is more preferably used. This makes it possible to improve soldering heat resistance after moisture absorption and flammability of the second resin layer 32.

As used herein, the term "aryl alkylene type epoxy resin" refers to an epoxy resin having at least one aryl alkylene group in a single repeating unit thereof. Examples of the aryl alkylene type epoxy resin include xylene type epoxy resin, biphenyl dimethylene type epoxy resin and the like. Among them, the biphenyl dimethylene type epoxy resin is preferably used. The biphenyl dimethylene type epoxy resin can be represented, for example, by the following formula (7).

easily handled. On the other hand, if the average repeating unit number "n" exceeds the upper limit value of the above described range, there is a case that formation failure or the like of the second resin layer 32 occurs due to lowering of flowability of the biphenyl dimethylene type epoxy resin.

An amount of the epoxy resin contained in the second resin composition is not particularly limited to a specific value, but is preferably in the range of 1 to 55 wt %, and more preferably in the range of 2 to 40 wt %, based on the total amount of the second resin composition. If the amount of the epoxy resin is less than the lower limit value of the above range, there is a case that reactivity of the epoxy resin with the cyanate resin or moisture resistance of the resulting semiconductor device (product) 100 is lowered. On the other hand, if it exceeds the upper limit value of the above range, there is a case that the heat resistance of the second resin layer 32 is lowered.

A weight-average molecular weight of the epoxy resin is not particularly limited to a specific value, but is preferably in the range of 500 to 20,000, and more preferably in the range of 800 to 15,000. If the weight-average molecular weight of the epoxy resin is less than the lower limit value of the above range, there is a case that the second resin layer 32 becomes tacky. On the other hand, if it exceeds the upper limit value of the above range, it is impossible to sufficiently supply the second resin composition into the through-hole 1 during the formation of the second resin layer 32. For this reason, there is a case that homogeneous semiconductor devices (products) 100 cannot be obtained.

The weight-average molecular weight of the epoxy resin can be measured using, for example, a gel permeation chromatography (GPC).

In the case where the cyanate resin (particularly, novolak type cyanate resin) is used as the thermosetting resin, a phenol resin is preferably used in combination with the cyanate resin. Examples of the phenol resin include novolak type phenol resin, resol type phenol resin, aryl alkylene type phenol resin and the like. These phenol resins may be used alone or in a mixture of two or more having different weight-average

[Formula 7]

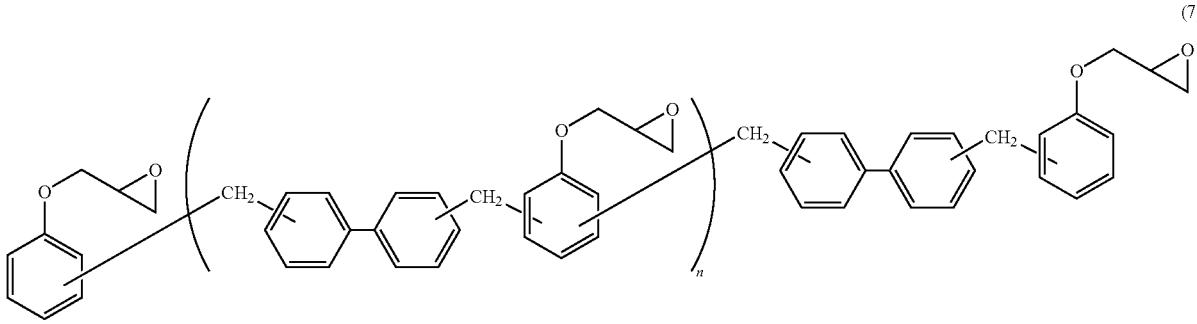

(7)

An average repeating unit number "n" of the biphenyl dimethylene type epoxy resin represented by the above formula (7) is not particularly limited to a specific value, but is preferably in the range of 1 to 10, and more preferably in the range of 2 to 5. If the average repeating unit number "n" is less than the lower limit value of the above range, the biphenyl dimethylene type epoxy resin tends to be crystallized so that solubility thereof in a general purpose solvent becomes relatively low. For this reason, there is a case that it becomes difficult that the biphenyl dimethylene type epoxy resin is molecular weights. Further, one or more phenol resins may be mixed with prepolymers thereof. Among them, the aryl alkylene type phenol resin is preferably used. This makes it possible to improve the soldering heat resistance after moisture absorption of the semiconductor element 100.

Examples of the aryl alkylene type phenol resin include xylene type phenol resin, biphenyl dimethylene type phenol resin and the like. The biphenyl dimethylene type phenol resin can be represented by, for example, the following formula (8).

[Formula 8]

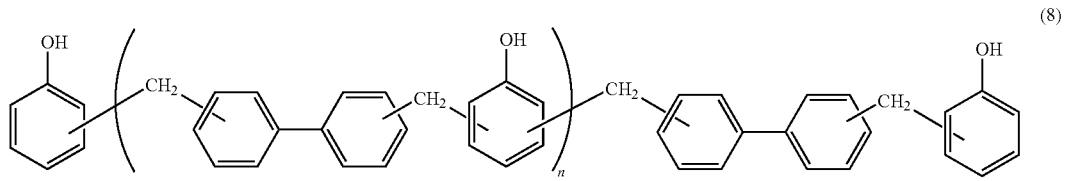

(8)

An average repeating unit number "n" of the biphenyl dimethylene type phenol resin represented by the above formula (8) is not particularly limited to a specific value, but is preferably in the range of 1 to 12, and more preferably in the range of 2 to 8. If the average repeating unit number "n" is less than the lower limit value of the above range, there is a case that the heat resistance of the second resin layer 32 is lowered. On the other hand, if it exceeds the upper limit value of the above range, compatibility thereof with other resins is lowered. For this reason, there is a case that it becomes difficult that the biphenyl dimethylene type phenol resin is easily handled.

By combining the cyanate resin (particularly, novolak type cyanate resin) with the aryl alkylene type phenol resin, the cross-linking density in the second resin composition can be controlled and the reactivity of the second resin composition can be easily controlled.

An amount of the phenol resin contained in the second resin composition is not particularly limited to a specific value, but is preferably in the range of 1 to 55 wt %, and more preferably in the range of 5 to 40 wt %, based on the total amount of the second resin composition. If the amount of the phenol resin is less than the lower limit value of the above range, there is a case that the heat resistance of the second resin layer 32 is lowered. On the other hand, if it exceeds the upper limit value of the above range, there is a case that the properties such as the low thermal expansion of the second resin layer 32 is deteriorated.

A weight-average molecular weight of the phenol resin is not particularly limited to a specific value, but is preferably in the range of 400 to 18,000, and more preferably in the range of 500 to 15,000. If the weight-average molecular weight of the phenol resin is less than the lower limit value of the above range, there is a case that the second resin layer 32 becomes tacky. On the other hand, if it exceeds the upper limit value of the above range, it is impossible to sufficiently supply the second resin composition into the through-hole 1 during the formation of the second resin layer 32. For this reason, there is a case that homogeneous semiconductor devices (products) 100 cannot be obtained.

The weight-average molecular weight of the phenol resin can be measured using, for example, a gel permeation chromatography (GPC).

Furthermore, in the case where the second resin layer 32 is formed using a combination of the cyanate resin (particularly, novolak type cyanate resin), phenol resin (e.g., aryl alkylene type phenol resin, particularly, biphenyl dimethylene type phenol resin) and the epoxy resin (e.g., aryl alkylene type epoxy resin, particularly, biphenyl dimethylene type epoxy resin), it is possible to obtain a second resin layer 32 having excellent dimensional stability.

The second resin composition may contain a coupling agent additionally. The coupling agent can improve wettability in interfaces between the thermosetting resin and the particles of the inorganic filler. For this reason, it is possible to uniformly distribute the thermosetting resin and the inorganic filler in the resulting second resin layer 32, thus improving the heat resistance, particularly, the heat resistance after moisture absorption of the second resin layer 32.

As the coupling agent, any compound may be used as long as it is conventionally used as a coupling agent. Specifically, as the coupling agent, at least one selected from the group comprising an epoxy silane coupling agent, a cationic silane coupling agent, an amino silane coupling agent, a titanate based coupling agent and a silicone oil type coupling agent is preferably used. This makes it possible to enhance the wettability in the interfaces between the thermosetting resin and the particles of the inorganic filler, thereby further improving the heat resistance of the second resin layer 32.

An amount of the coupling agent contained in the second resin composition is not particularly limited to a specific value depending on a specific surface area of the particles of the inorganic filler, but is preferably in the range of 0.05 to 3 parts by weight, and more preferably in the range of 0.1 to 2 parts by weight, with respect to 100 parts by weight of the inorganic filler. If the amount of the coupling agent is less than the lower limit value of the above range, the particles of the inorganic filler cannot be sufficiently coated with the coupling agent in the second resin layer 32. For this reason, there is a case that the effect of improving the heat resistance of the second resin layer 32 is lowered. On the other hand, if it exceeds the upper limit value of the above range, there is a case that the coupling agent influences the reaction of the second resin composition, to thereby lower bending strength and the like of the second resin layer 32.

The second resin composition may, if needed, contain a curing accelerator. As the curing accelerator, any known curing accelerator may be used in the present invention. Examples of the curing accelerator include: organic metal salts such as zinc naphthenate, cobalt naphthenate, tin octylate, cobalt octylate, cobalt (II) bisacetyl acetate and cobalt (III) trisacetyl acetonate; tertiaryamines such as triethyl amine, tributyl amine and diazabicycle[2,2,2]octane; imidazoles such as 2-phenyl-4-methyl imidazole, 2-ethyl-4-ethyl imidazole, 2-phenyl-4-methyl imidazole, 2-phenyl-4-methyl-5-hydroxyimidazole and 2-phenyl-4,5-dihydroxyimidazole; phenol compounds such as phenol, bisphenol A and nonyl phenol, organic acids such as acetic acid, benzoic acid, salicylic acid and paratoluenesulfonic acid, and a mixture thereof. These curing accelerators may be used alone or in a mixture of two or more, and derivatives thereof may also be used alone or in a mixture of two or more.

An amount of the curing accelerator contained in the second resin compound is not particularly limited to a specific value, but is preferably in the range of 0.05 to 5 wt %, and more preferably in the range of 0.2 to 2 wt %, based on the total amount of the second resin composition. If the amount of the curing accelerator is less than the lower limit value of the above range, there is a case that the effect of accelerating the curing of the second resin composition cannot be sufficiently obtained. On the other hand, if it exceeds the upper limit value of the above range, there is a case that storage stability of the second resin layer 32 is lowered.

The second resin composition may contain thermoplastic resins such as phenoxy resin, polyimide resin, polyamide imide resin, polyphenylene oxide resin, polyether sulfone resin, polyester resin, polyethylene resin and polystyrene resin, thermoplastic elastomers such as polystyrene-based thermoplastic elastomer (e.g., styrene-butadiene copolymer, styrene-isoprene copolymer), polyolefin-based thermoplastic elastomer, polyamide-based thermoplastic elastomer and polyester-based elastomer, or diene-based elastomers such as polybutadiene, epoxy-modified polybutadiene, acryl-modified polybutadiene and methacryl-modified polybutadiene.

Further, the second resin composition may, if needed, contain additives such as a pigment, a dye, a defoaming agent, a leveling agent, a UV absorbing agent, a foaming agent, an antioxidant, a flame retardant and an ion catcher in addition to the above components.

By applying the above second resin composition to the first resin layer 31 using 1) a method of applying the second resin composition in a varnish state and then drying the same or 2) a method of laminating the second resin composition in a film state, the second resin composition can fill the through-hole 1 and cover the one surface 102 of the semiconductor substrate 10. Thereafter, a part of the second resin layer 32 is selectively removed by, for example, laser processing or the like, to thereby expose the terminal 2 from the second resin layer 32.

In this embodiment, in a state that the terminal 2 is exposed from the first resin layer 31 as described above, the part of the second layer 32 is selectively removed to expose the terminal 2 again, thus obtaining the second resin layer 32. In this case, a portion to be removed by the laser processing exists in only the second resin layer 32. Since the second resin layer 32 is formed of a material having excellent heat resistance, it is possible to reliably prevent the second resin layer 32 near the exposed terminal 2 from being altered and deteriorated, even in the case where the part of the second resin layer 32 is removed by the laser processing.

(Third Resin Layer 33)

The third resin layer 33 is preferably formed of a third resin composition which is the same as the above resin composition, that is, the resin composition having the constitution A which is composed of the resin having the radical-polymerizable double bond, the thermosetting resin, and the resin which differs from the resin having the radical-polymerizable double bond and has the alkali-soluble group and the double bond; the resin composition having the constitution B which is composed of the cyclic olefin resin; or the mixture thereof. This makes it possible for the through-hole 1 formed through the semiconductor substrate 10 to be reliably and sufficiently filled with the third resin layer 33, while precisely suppressing the occurrence of the warpage of the semiconductor substrate 10.

Further, the third resin layer 33 may be formed in the same manner as described in the first resin layer 31.

As described above, in the semiconductor device 500 of the second embodiment, the through-hole 1 formed through the semiconductor substrate 10 is filled with the first resin layer 31 and the second resin layer 32 which have different elastic moduluses. This makes it possible to suppress the occurrence of the warpage of the semiconductor substrate 10. Specifically, by forming the first resin layer 31 provided on the side of the semiconductor substrate 10 using a resin having low elastic modulus, it can have a function of relieving stress which would occur in the semiconductor substrate 10. On the other hand, since the second resin layer 32, which is provided so as to be applied to the first resin layer 31 and has an elastic modulus higher than that of the first resin layer 31, is formed of a resin having a low coefficient of thermal expansion and high heat resistance, it is possible to reduce damage to a sidewall defining a through-hole 1 in a process for forming the through-hole 1 using laser (that is, it is possible to impart laser processability to the second resin layer 32).

EXAMPLES

Hereinafter, the present invention will be described in detail with reference to Examples and Comparative Examples, but is not limited thereto.

Example 1A

1. Synthesis of Resin Having Alkali-Soluble Group and Double bond (Resin Curable by Both Light and Heat), that is, Methacryl-Modified Bisphenol a Type Novolak Resin (MPN)

500 g of a MEK solution (having a solid content of 60%) containing bisphenol A type novolak resin ("Phenolite LF-4871" produced by Dainippon Ink Chemicals, Incorporated) was added into a 2 L flask, 1.5 g of tributyl amine as a catalyst and 0.15 g of hydroquinone as a polymerization inhibitor were added to the MEK solution, and then the same was heated to 100° C. 180.9 g of glycidyl methacrylate was added to the MEK solution by drops over 30 minutes, and then the same was stirred at 100° C. for 5 hours to react the bisphenol A type novolak resin with the glycidyl methacrylate. In this way, methacryl-modified bisphenol A type novolak resin (methacryl modification ratio: 50%) having a nonvolatile content of 74% was obtained.

2. Preparation of Resin Varnish 31.74 wt % of the methacryl-modified bisphenol A type novolak resin (MPN) as a resin having an alkali-soluble group and a double bond, 9.83 wt % of liquid acrylic resin monomer ("NK Ester 3G" produced by Shin-Nakamura Chemical Corporation) as a photo-polymerizable resin, 19.84 wt % of bisphenol A type novolak epoxy resin ("Epicron N-865" produced by Dainippon Ink Chemicals, Incorporated) as a thermosetting resin, 3.63 wt % of silicone epoxy resin ("BY16-115" produced by Dow Corning Toray Silicone Co., Ltd.) as a thermosetting resin, and 33.71 wt % of silica having an average particle size of 0.5 μm and a maximum particle size of 2 μm ("SO-E2" produced by Admatechs Co., Ltd.) as a particulate filler were weighed, and then methyl ethyl ketone (MEK; produced by Daishin Chemical Co., Ltd.) was added to these resin components to prepare a mixture so that a concentration of the resin components contained in the mixture would become 71%. Thereafter, the mixture was stirred until the bisphenol A type novolak epoxy resin (N-865) was dissolved into the mixture.

Next, the silica was dispersed into the mixture using a beads mill (bead diameter: 400 μm, treatment speed: 6 g/s, 5 passes).

In addition, 1.25 wt % of a sensitizer ("IRGACURE 651" produced by Ciba Specialty Chemicals Inc.) as a curing agent was added to the mixture, and then the same was stirred with a stirrer blade at 450 rpm for 1 hour. In this way, a resin varnish was obtained.

3. Preparation of Film for Through-Hole Filling Material

The above resin varnish was applied to polyester film having a thickness of 25 μm ("T100G" produced by Mitsubishi Polyester Film Corporation) which was a support base material using a comma coater, and then dried at 80° C. for 10 minutes. In this way, a film for through-hole filling material having a thickness of 50 μm was obtained.

4. Manufacture of Semiconductor Device

A semiconductor element having a through-hole and a plating layer formed on the inner circumferential surface defining the through-hole by a plating treatment was prepared. In this semiconductor element, a functional surface and a back surface of a semiconductor substrate included in the semiconductor element had been electrically connected together through the plating layer. Thereafter, the above film for through-hole filling material provided on the polyester film was vacuum-laminated on the semiconductor element (semiconductor substrate) at 60° C. In this way, the through-hole was filled with the film for through-hole filling material and a thickness of the film located on the back surface side of the semiconductor substrate was set to 50 µm.

Next, the film for through-hole filling material was exposed by irradiation of light with an exposure amount of 200 mJ/cm$^2$ and a wavelength of 365 nm through a mask having a predetermine shape. Thereafter, the irradiated film was developed using a 3% TMAH at a spray pressure of 0.2 MPa for 120 seconds to form an opening therethrough. Next, the film for through-hole filling material was cured by subjecting a thermal treatment thereto at 150° C. for 90 minutes. In this way, a through-hole filling material (insulating layer) including a filling portion filling the through-hole and a layer-shaped insulating portion covering the back surface of the semiconductor substrate was obtained. Subsequently, a soldering ball was mounted on the back surface of the semiconductor substrate within the opening. In this way, a semiconductor device was obtained.

In this regard, it is to be noted that a minimum melt viscosity at room temperature to 180° C. of the film for through-hole filling material was 801 Pa·s.

Example 2A

A semiconductor device was manufactured in the same manner as Example 1A, except that the resin varnish was prepared as follows so as to increase the amount of inorganic filler contained therein.

23.94 wt % of the above methacryl-modified bisphenol A type novolak resin (MPN) as a resin having an alkali-soluble group and a double bond, 7.41 wt % of the above acrylic resin monomer kept in the liquid state at room temperature ("NK Ester 3G" produced by Shin-Nakamura Chemical Corporation) as a photo-polymerizable resin, 14.97 wt % of the above bisphenol A type novolak epoxy resin ("Epicron N-865" produced by Dainippon Ink Chemicals, Incorporated) as a thermosetting resin, 2.74 wt % of the above silicone epoxy resin ("BY16-115" produced by Dow Corning Toray Silicone Co., Ltd.) as a thermosetting resin, and 50.00 wt % of the above silica having the average particle size of 0.5 µm and the maximum particle size of 2 µm ("SO-E2" produced by Admatechs Co., Ltd.) as a particulate filler were weighed, and then methyl ethyl ketone (MEK; produced by Daishin Chemical Co., Ltd.) was added to these resin components to prepare a mixture so that a concentration of the resin components contained in the mixture would become 71%. Thereafter, the mixture was stirred until the bisphenol A type novolak epoxy resin (N-865) was dissolved into the mixture.

Next, the silica was dispersed into the mixture using a beads mill (bead diameter: 400 µm, treatment speed: 6 g/s, 5 passes).

In addition, 0.94 wt % of the above sensitizer ("IRGA-CURE 651" produced by Ciba Specialty Chemicals Inc.) as a curing agent was added to the mixture, and then the same was stirred with a stirrer blade at 450 rpm for 1 hour. In this way, a resin varnish was obtained.

In this regard, it is to be noted that a minimum melt viscosity at room temperature to 180° C. of the film for through-hole filling material was 3,106 Pa·s.

Comparative Example 1A

A semiconductor device was manufactured in the same manner as Example 1A, except that the resin varnish was prepared as follows without using the resin having the alkali-soluble group and the double bond.

14.40 wt % of the above acrylic resin monomer kept in the liquid state at room temperature ("NK Ester 3G" produced by Shin-Nakamura Chemical Corporation) as a photo-polymerizable resin, 29.07 wt % of the above bisphenol A type novolak epoxy resin ("Epicron N-865" produced by Dainippon Ink Chemicals, Incorporated) as a thermosetting resin, 5.32 wt % of the above silicone epoxy resin ("BY16-115" produced by Dow Corning Toray Silicone Co., Ltd.) as a thermosetting resin, and 49.38 wt % of the above silica having the average particle size of 0.5 µm and the maximum particle size of 2 µm ("SO-E2" produced by Admatechs Co., Ltd.) as a particulate filler were weighed, and then methyl ethyl ketone (MEK; produced by Daishin Chemical Co., Ltd.) was added to these resin components to prepare a mixture so that a concentration of the resin components contained in the mixture would become 71%. Thereafter, the mixture was stirred until the bisphenol A type novolak epoxy resin (N-865) was dissolved into the mixture.

Next, the silica was dispersed into the mixture using a beads mill (bead diameter: 400 µm, treatment speed: 6 g/s, 5 passes).

In addition, 1.83 wt % of the above sensitizer ("IRGA-CURE 651" produced by Ciba Specialty Chemicals Inc.) as a curing agent was added to the mixture, and then the same was stirred with a stirrer blade at 450 rpm for 1 hour. In this way, a resin varnish was obtained.

A film for through-hole filling material was prepared using the above obtained resin varnish, but a film forming property of the resin varnish was insufficient, because cracks occurred in the film. For this reason, the following evaluations could not be carried out on Comparative Example 1A.

Each of the films for through-hole filling material and the semiconductor devices obtained in Examples and Comparative Example was evaluated as follows. Evaluation items are shown together with evaluation contents. The obtained results are shown in Table 1.

1. Through-Hole Filling Property

The obtained film for through-hole filling material was laminated on a semiconductor substrate having a through-hole which was included in a semiconductor element at 60° C. so that the through-hole was filled therewith. Thereafter, the film was exposed by irradiation of light with an exposure amount of 200 mJ/cm$^2$, and then cured at 150° C. for 90 minutes. Next, the semiconductor element was cut, and then a cross-section of a portion including the through-hole thereof was polished and buffed. The cross-section of the semiconductor element was checked using a microscope, and a height of a region of the through-hole filled with the through-hole filling material was measured and evaluated based on the following criteria.

A: 95% or more region of the through-hole was filled with the through-hole filling material.

B: 80% or more but less than 95% region of the through-hole was filled with the through-hole filling material.

C: 50% or more but less than 80% region of the through-hole was filled with the through-hole filling material.

D: Only less than 50% region of the through-hole was filled with the through-hole filling material.

2. Developability

To evaluate developability of the obtained film for through-hole filling material, the film was dipped into a 3% TMAH (tetramethyl ammonium hydroxide) at 25° C. In the case where the resin was dissolved into the TMAH within 3 minutes so that it did not remain on the polyester film which was the support base material, it was determined to be "developable", whereas in the case where the resin remained on the polyester film, it was determined to be "non-developable". Each symbol indicates the following content.

A: developable.

B: non-developable.

3. Resolution (Open Area Ratio)

Resolution of the film for through-hole filling material was evaluated based on an open area ratio as follows.

The obtained film for through-hole filling material was laminated on a polyimide film at 60° C., and then patterned by irradiation of light with an exposure amount of 200 mJ/cm$^2$ and a wavelength of 365 nm via a negative-type film mask by which an opening having a diameter of 200 μm could be opened through the film.

Thereafter, the irradiated film was developed using a 3% TMAH at a spray pressure of 0.1 MPa for 90 seconds, and then an opening diameter of the patterned opening (test hole) was measured by a measuring microscope. The open area ratio was calculated according to the following equation.

Open area ratio (%)=measured opening diameter (μm)/mask opening diameter 200 (μm)×100

TABLE 1

| | | | Ex. 1A | Ex. 2A | Com. Ex. 1A |
|---|---|---|---|---|---|
| Composition | Resin having alkali-soluble group and double bond | Methacryl-modified bisphenol A type novolak resin (MPN) (wt %) | 31.74 | 23.94 | 0 |
| | Photo-polymerizable resin | Acrylic resin monomer (triethylene glycol dimethacrylate; product name: NK Ester 3G) (wt %) | 9.83 | 7.41 | 14.40 |
| | Thermosetting resin | Bisphenol A type novolak epoxy resin (product name: Epicron N-865) (wt %) | 19.84 | 14.97 | 29.07 |
| | | Silicone epoxy resin (product name: BY16-115) (wt %) | 3.63 | 2.74 | 5.32 |
| | Curing agent | Sensitizer (product name: IRGACURE 651) (wt %) | 1.25 | 0.94 | 1.83 |
| | Inorganic filler | Silica (product name: SO-E2) (wt %) | 33.71 | 50.00 | 49.38 |
| Evaluation | | Filling property | A | A | — |
| | | Developability | A | A | — |
| | | Resolution | 99 | 95 | — |

As is evident from Table 1, the through-hole filling materials of Examples 1A and 2A showed excellent properties for filling the through hole.

The films for through-hole filling material of Examples 1A and 2A had excellent developability and resolution.

Example 1B

1. Preparation of First Resin Varnish for Forming First Resin Layer

As a cyclic olefin resin having a photoreactive functional group, a terpolymer of decyl norbornene/glycidyl methyl norbornene/phenethyl norbornene=31/30/39 was used. The terpolymer was prepared in the following manner. All glass devices were dried at 60° C. at 0.1 Torr for 18 hours. Thereafter, the glass devices were placed in a glove box. Next, ethyl acetate (917 g), cyclohexane (917 g), decyl norbornene (73 g, 0.31 mol), glycidyl methyl ethernorbornene (177 g, 0.30 mol) and phenethyl norbornene (77.2 g, 0.39 mol) were added into a reaction flask. The reaction flask was taken out of the glove box, and a solution in the flask was degassed by passing a nitrogen gas through the solution for 30 minutes. Next, in the glove box, 9.36 g (19.5 mmol) of bistolueneperfluorophenyl nickel as a catalyst was dissolved into 15 mL of toluene to prepare a toluene solution, and then the toluene solution was added into a 25 mL syringe, taken out of the glove box, and then added to the solution in the reaction flask. Thereafter, the solution in the flask was stirred at 20° C. for 5 hours to react the above monomers with each other, peracetic acid solution (975 mmol) was added to the solution, and then the same was stirred for 18 hours. After being stirred, a reaction solution was separated into an aqueous layer and a solvent layer, and then the aqueous layer was removed. To the remaining solvent layer, 1 L of distilled water was added, the solvent layer was stirred for 20 minutes, and then an aqueous layer separated from the solvent layer was removed. This washing process was repeated three times. The washed reaction solution was added to methanol, and a produced precipitate was collected by filtration, washed sufficiently with water and then dried in a vacuum. After being dried, 309 g (a yield of 92%) of the terpolymer was collected. A molecular weight date of the obtained terpolymer were Mw=71,000, Mn=32,000 and Mw/Mn=2.2, as measured by GPC. Further, the terpolymer had a composition of 31 mol % decyl norbornene, 30 mol % epoxynorbornene and 39 mol % phenethyl norbornene, as analyzed by H-NMR.

In this regard, it is to be noted that a first resin layer obtained using a first resin varnish containing the above obtained terpolymer had an elastic modulus of 1,500 MPa and a coefficient of thermal expansion of 140 ppm (100 to 200° C.)

2. Preparation of Second Resin Film for Forming Second Resin Layer 30 parts by weight of novolak type cyanate resin having a weight-average molecular weight of 700 ("PRIMASET PT-30" produced by Lonza) as a cyanate resin, 15 parts by weight of biphenyl dimethylene type epoxy resin having an epoxy equivalent of 275 and a weight-average molecular weight of 2,000 ("NC-3000" produced by Nippon Kayaku Co., Ltd.) as an epoxy resin, 15 parts by weight of a copolymer of biphenyl epoxy resin and bisphenol S epoxy resin having epoxy groups at terminal ends thereof and a weight-average molecular weight of 30,000 ("YX-8100H30" produced by Japan Epoxy Resins Co., Ltd.) as a phenoxy resin, and 0.1 parts by weight of an imidazole compound ("Curezol 1B2PZ (1-benzyl-2-phenyl imidazole)" produced by Shikoku Chemicals Corporation) as a curing catalyst were dissolved and dispersed into methyl ethyl ketone to obtain a mixture. In addition, 40 parts by weight of spherical fused silica having an average particle size of 0.5 μm ("SO-25H" produced by Admatechs Co., Ltd.) as an inorganic filler and 0.2 parts by weight of an epoxy silane coupling agent ("A-187" produced by Nippon Unicar Co., Ltd.) as a coupling agent were added to the mixture, and the same was stirred using a high speed stirrer for 10 minutes. In this way, a second resin varnish having a solid content of 50 wt % was prepared.

The second resin varnish thus obtained was applied to one surface of a PET (polyethylene terephthalate) film having a thickness of 25 μm using a comma coater, and then dried in a dryer at 160° C. for 10 minutes. In this way, a second resin film (insulating film) with the PET film was obtained. In this regard, a thickness of the second resin film after being dried was 40 μm.

In this regard, it is to be noted that a second resin layer obtained using the above second resin varnish had an elastic modulus of 4,000 MPa and a coefficient of thermal expansion of 30 ppm.

3. Manufacture of Semiconductor Device

The above first resin varnish was applied to a semiconductor substrate having a diameter of Φ200 mm and a thickness of 150 μm in which a through-hole having a diameter of Φ100 μm extended through the semiconductor substrate in a thickness direction thereof, and then dried. In this way, a first resin layer having a thickness of 40 μm, filling the through-hole and covering a lower side of the semiconductor substrate was obtained.

Next, the first resin layer was patterned using a general exposure (i line)/development process so that it remained only on a necessary portion of the lower side of the semiconductor substrate and an inner circumference surface defining the through-hole of the semiconductor substrate. Therefore, the patterned first resin layer was cured in an oven at 160° C. for 1 hour.

Next, the second resin film was vacuum-laminated on the first resin layer so as to cover the first resin layer and fill the through-hole to form a second resin layer having a thickness of 40 μm. A hole was formed at a central part of a portion of the second resin layer corresponding to the through-hole of the first resin layer using UV laser having a wavelength of 355 nm, and then the second resin layer was cured in an oven at 200° C. for 1.5 hr. In this way, a semiconductor device was obtained.

Example 2B

A semiconductor device was manufactured in the same manner as Example 1B, except that the composition of the first resin varnish constituting the first resin layer was changed as follows.

A terpolymer of the above decyl norbornene/the above glycidyl methyl norbornene/the above phenethyl norbornene=45/30/25 was prepared in the same manner as Example 1B, except that 106 g (0.45 mol) of the decyl norbornene, 177 g (0.30 mol) of the glycidyl methyl norbornene and 49.5 g (0.25 mol) of the phenethyl norbornene were used, respectively. 319 g (a yield of 95%) of the terpolymer was collected by polymerization, reprecipitation and drying. A molecular weight date of the obtained terpolymer were Mw=69,000, Mn=31,000 and Mw/Mn=2.2, as measured by GPC. Further, the terpolymer had a composition of 44 mol % decyl norbornene, 31 mol % epoxynorbornene and 25 mo % phenethylnorbornene, as analyzed by H-NMR.

In this regard, it is to be noted that a first resin layer obtained using a first resin varnish containing the above obtained copolymer had an elastic modulus of 900 MPa and a coefficient of thermal expansion of 200 ppm (100 to 200° C.)

Example 3B

A semiconductor device was manufactured in the same manner as Example 1B, except that the composition of the second resin varnish constituting the second resin layer was changed as follows.

40 parts by weight of the above novolak type cyanate resin having the weight-average molecular weight of 700 ("PRIMASET PT-30" produced by Lonza) as a cyanate resin, 20 parts by weight of the above biphenyl dimethylene type epoxy resin having the epoxy equivalent of 275 and the weight-average molecular weight of 2,000 ("NC-3000" produced by Nippon Kayaku Co., Ltd.) as an epoxy resin, 20 parts by weight of the above copolymer of the biphenyl epoxy resin and the bisphenol S epoxy resin having the epoxy groups at the terminal ends thereof and the weight-average molecular weight of 30,000 ("YX-8100H30" produced by. Japan Epoxy Resins Co., Ltd.) as a phenoxy resin, and 0.1 parts by weight of the above imidazole compound ("Curezol 1B2PZ (1-benzyl-2-phenyl imidazole)" produced by Shikoku Chemicals Corporation) as a curing catalyst were dissolved and dispersed into methyl ethyl ketone to obtain a mixture. In addition, 20 parts by weight of the above spherical fused silica having the average particle size of 0.5 μm ("50-25H" produced by Admatechs Co., Ltd.) as an inorganic filler and 0.2 parts by weight of the above epoxy silane coupling agent ("A-187" produced by Nippon Unicar Co., Ltd.) as a coupling agent were added to the mixture, and the same was stirred using a high speed stirrer for 10 minutes. In this way, a second resin varnish having a solid content of 50 wt % was prepared.

The second resin varnish thus obtained was applied to one surface of a PET (polyethylene terephthalate) film having a thickness of 25 μm using a comma coater, and then dried in a dryer at 160° C. for 10 minutes. In this way, a second resin film (insulating film) with the PET film was obtained. In this regard, a thickness of the second resin film after being dried was 40 μm.

In this regard, it is to be noted that a second resin layer obtained using the above second resin varnish had an elastic modulus of 3,500 MPa and a coefficient of thermal expansion of 42 ppm.

Example 4B

A semiconductor device was manufactured in the same manner as Example 1B, except that the first resin layer was formed using polyamide resin (nylon 12) prepared by dehydration and polycondensation of 12-aminododecanoic acid. In this regard, it is to be noted that the first resin layer obtained using the polyamide resin had an elastic modulus of 1,080 MPa and a coefficient of thermal expansion of 12 ppm (100 to 200° C.)

Example 5B

A semiconductor device was manufactured in the same manner as Example 1B, except that the composition of the second resin varnish constituting the second resin layer was changed as follows.

15 parts by weight of novolak type phenyl resin having a hydroxyl group equivalent of 105 ("PR-HF-3" produced by Sumitomo Bakelite Co., Ltd.) as a phenol resin, 25 parts by weight of bisphenol F type epoxy resin having an epoxy equivalent of 175 ("830-S" produced by Dainippon Ink Chemicals, Incorporated) as an epoxy resin, 20 parts by weight of a polymer of bisphenol F type epoxy resin having epoxy groups at terminal ends thereof and an epoxy equivalent of 4,400 ("4010P" produced by Japan Epoxy Resins Co., Ltd.) as a phenoxy resin, and 0.1 parts by weight of an imidazole compound ("Curezol 2PHZ (2-phenyl-4,5-dihydroxymethyl imidazole)" produced by Shikoku Chemicals Corporation) as a curing catalyst were dissolved and dispersed into methyl ethyl ketone to obtain a mixture. In addition, 40 parts by weight of the above spherical fused silica having the average particle size of 0.5 μm ("SO-25H" produced by Admatechs Co., Ltd.) as an inorganic filler and 0.2 parts by weight of the above epoxy silane coupling agent ("A-187" produced by Nippon Unicar Co., Ltd.) as a coupling agent were added to the mixture, and the same was stirred using a high speed stirrer for 10 minutes. In this way, a second resin varnish having a solid content of 50 wt % was prepared.

The second resin varnish thus obtained was applied to one surface of a PET (polyethylene terephthalate) film having a thickness of 25 μm using a comma coater, and then dried in a dryer at 160° C. for 10 minutes. In this way, a second resin film (insulating film) with the PET film was obtained. In this regard, a thickness of the second resin film after being dried was 40 μm.

In this regard, it is to be noted that the second resin film (second resin layer) obtained using the above resin varnish had an elastic modulus of 4,800 MPa and a coefficient of thermal expansion of 40 ppm.

Comparative Example 1B

A semiconductor device was manufactured in the same manner as Example 1B, except that the through-hole was filled only with the second resin layer without using the first resin layer.

Comparative Example 2B

A semiconductor device was manufactured in the same manner as Example 1B, except that the composition of the first resin varnish constituting the first resin layer was changed as follows and the first resin layer was formed using a laminating process instead of the applying process.

20 parts by weight of novolak type cyanate resin having a weight-average molecular weight of 700 ("PRIMASET PT-30" produced by Lonza) as a cyanate resin, 10 parts by weight of biphenyl dimethylene type epoxy resin having an epoxy equivalent of 275 and a weight-average molecular weight of 2,000 ("NC-3000" produced by Nippon Kayaku Co., Ltd.) as an epoxy resin, 10 parts by weight of a copolymer of biphenyl epoxy resin and bisphenol S epoxy resin having epoxy groups at terminal ends thereof and a weight-average molecular weight of 30,000 ("YX-8100H30" produced by Japan Epoxy Resins Co., Ltd.) as a phenoxy resin, and 0.1 parts by weight of an imidazole compound ("Curezol 1B2PZ (1-benzyl-2-phenyl imidazole)" produced by Shikoku Chemicals Corporation) as a curing catalyst were dissolved and dispersed into methyl ethyl ketone to obtain a mixture. In addition, 60 parts by weight of spherical fused silica having an average particle size of 0.5 μm ("SO-25H" produced by Admatechs Co., Ltd.) as an inorganic filler and 0.2 parts by weight of an epoxy silane coupling agent ("A-187" produced by Nippon Unicar Co., Ltd.) as a coupling agent were added to the mixture, and the same was stirred using a high speed stirrer for 10 minutes. In this way, a second resin varnish having a solid content of 50 wt % was prepared.

The first resin varnish thus obtained was applied to one surface of a PET (polyethylene terephthalate) film having a thickness of 25 μm using a comma coater, and then dried in a dryer at 160° C. for 10 minutes. In this way, a first resin film (insulating film) with the PET film was obtained. In this regard, a thickness of the first resin film after being dried was 40 μm.

In this regard, it is to be noted that a first resin layer obtained using the above first resin varnish had an elastic modulus of 5,500 MPa and a coefficient of thermal expansion of 20 ppm.

Each of the semiconductor devices obtained in Examples and Comparative Examples was evaluated as follows. Evaluation items were shown together with evaluation contents. The obtained results are shown in Table 2.

1. Warpage

Warpage of the semiconductor device was evaluated using a contact type warpage measuring apparatus.

2. Reliability

To evaluate reliability of the semiconductor device, whether swelling and peeling of the resin in the semiconductor device occur was evaluated after the semiconductor device was subjected to a thermal treatment at 180° C. for 5 hrs and 10 times IR reflow at 260° C. Twenty semiconductor devices in each of Examples and Comparative Examples were evaluated. Each symbol indicates the following content.

A: The swelling and peeling of the resin do not occur in 18 to 20 semiconductor devices among 20 semiconductor devices.

B: The swelling and peeling of the resin do not occur in 16 to 17 semiconductor devices among 20 semiconductor devices.

C: The swelling and peeling of the resin do not occur in 13 to 15 semiconductor devices among 20 semiconductor devices. In other words, those occur in some semiconductor devices.

D: The swelling and peeling of the resin do not occur in 1 to 12 semiconductor devices among 20 semiconductor devices. In other words, those occur in many semiconductor devices.

3. Laser Processability

In the case where the hole was formed at the central part of the portion of the second resin layer corresponding to the through-hole of the first resin layer using the UV laser having the wavelength of 355 nm, laser processability of the second resin layer was evaluated. Each symbol indicates the following content.

A: When sidewall defining the hole was observed and analyzed, oxidation and/or carbonization were not shown.

B: When the sidewall was observed and analyzed, the oxidation and/or carbonization were shown.

TABLE 2

|  |  | Ex. 1B | Ex. 2B | Ex. 3B | Ex. 4B | Ex. 5B | Com. Ex. 1B | Com. Ex. 2B |
|---|---|---|---|---|---|---|---|---|
| First resin layer | Elastic modulus (MPa) | 1500 | 900 | 1500 | 1080 | 1500 | — | 5500 |
|  | Coefficient of thermal expansion (ppm) | 140 | 200 | 140 | 12 | 140 | — | 20 |
| Second resin layer | Elastic modulus (MPa) | 4000 | 4000 | 3500 | 4000 | 4800 | 4000 | 4000 |
|  | Coefficient of thermal expansion (ppm) | 30 | 30 | 42 | 30 | 40 | 30 | 30 |
|  | Warpage (μm) | 220 | 190 | 210 | 200 | 230 | 450 | 580 |
|  | Reliability | A | A | A | A | B | D | D |
|  | Laser processability | A | A | A | A | A | A | A |

As is evident from Table 2, warpage amounts of the semiconductor devices obtained in Examples 1B to 5B were reduced.

Further, the semiconductor devices obtained in Examples 1B to 5B particularly showed excellent reliability.

In addition, the second resin layers in Examples 1B to 5B also showed excellent laser processability.

INDUSTRIAL APPLICABILITY

The present invention can provide a resin composition which can reliably and sufficiently fill a through-hole formed through a semiconductor substrate while suppressing occurrence of warpage of the semiconductor substrate.

Further, according to the present invention, it is possible to obtain a semiconductor device which comprises a filling material and an insulating layer each composed of the above resin composition and has reduced warpage amount. This semiconductor device becomes small-sized and can have excellent properties.

In addition, a specific second resin layer can have particularly improved laser processability. Therefore, the present invention is industrially applicable.

What is claimed is:

1. A resin composition used for forming a filling material which fills at least a through-hole of a semiconductor substrate, the through-hole extending through the semiconductor substrate in a thickness direction thereof and having a conductive portion therein,
wherein the resin composition is composed of: a resin having a radical-polymerizable double bond, a thermosetting resin and a resin which differs from the resin having the radical-polymerizable double bond and has an alkali-soluble group and a double bond; or a cyclic olefin resin.

2. The resin composition as claimed in claim 1, wherein the semiconductor substrate has a functional surface and a surface opposite to the functional surface, and
wherein the resin composition is used for forming an insulating layer which fills the through-hole and covers the opposite surface of the semiconductor substrate.

3. The resin composition as claimed in claim 1, wherein the semiconductor substrate has a functional surface and a surface opposite to the functional surface, and
wherein the resin composition is used for forming an insulating layer which fills the through-hole and covers the opposite surface of the semiconductor substrate,
wherein the resin composition has such a property that an opening can be formed through the insulating layer using a photolithography method.

4. A filling material used for filling at least a through-hole of a semiconductor substrate, the through-hole extending through the semiconductor substrate in a thickness direction thereof and having a conductive portion therein, the filling material formed of a cured product of the resin composition defined by claim 1.

5. An insulating layer to be provided on a semiconductor substrate having at least a through-hole extending through the semiconductor substrate in a thickness direction thereof and having a conductive portion therein, a functional surface and a surface opposite to the functional surface, the insulating layer comprising:
a layer-shaped insulating portion provided on the opposite surface of the semiconductor substrate; and
a filling portion integrally formed with the insulating portion and filling the through-hole,
wherein the insulating layer is formed of a cured product of the resin composition defined by claim 1.

6. A semiconductor device comprising the filing material defined by claim 4.

7. A semiconductor device comprising the insulating layer defined by claim 5.

8. A semiconductor device comprising:
a semiconductor substrate having at least a through-hole extending through the semiconductor substrate in a thickness direction thereof, an inner surface defining the through-hole and one surface on which the through-hole is opened;
an insulating layer including a first resin layer formed so as to cover the inner surface defining the through-hole and the one surface of the semiconductor substrate, and a second resin layer applied to the first resin layer; and a conductive portion provided in the through-hole so as to pass through the first resin layer and the second resin layer, wherein an elastic modulus of the first resin layer is lower than that of the second resin layer.

9. The semiconductor device as claimed in claim 8, wherein the elastic modulus of the first resin layer is 2,500 MPa or lower.

10. The semiconductor device as claimed in claim 8, wherein the first resin layer is formed of a cured product of a first resin composition, and wherein the first resin composition is composed of: a resin having a radical-polymerizable double bond, a thermosetting resin and a resin which differs from the resin having the radical-polymerizable double bond and has an alkali-soluble group and a double bond; or a cyclic olefin resin.

11. The semiconductor device as claimed in claim 10, wherein the cyclic olefin resin comprises a norbornene resin having an epoxy group.

12. The semiconductor device as claimed in claim 8, wherein the first resin layer can be patterned by irradiation of light.

13. The semiconductor device as claimed in claim 8, wherein the elastic modulus of the second resin layer is 3,500 MPa or higher.

14. The semiconductor device as claimed in claim 8, wherein a coefficient of thermal expansion of the second resin layer at a glass transition temperature or lower temperature is 50 ppm or lower.

15. The semiconductor device as claimed in claim 8, further comprising a wiring pattern formed on a surface of the second resin layer opposite to the first resin layer and electrically connected to the conductive portion.

16. The semiconductor device as claimed in claim 15, wherein the insulating layer further includes a third resin layer formed so as to cover the conductive portion and at least a part of the wiring pattern and formed of a third resin composition, and wherein the third resin composition is composed of: a resin having a radical-polymerizable double bond, a thermosetting resin and a resin which differs from the resin having the radical-polymerizable double bond and has an alkali-soluble group and a double bond; or a cyclic olefin resin.

17. The semiconductor device as claimed in claim 8, further comprising a wiring pattern formed on a surface of the semiconductor substrate opposite to the insulating layer and electrically connected to the conductive portion.

\* \* \* \* \*